United States Patent [19]

Akiyama

[11] Patent Number: 5,614,728
[45] Date of Patent: Mar. 25, 1997

[54] THIN FILM TRANSISTOR AND FABRICATION METHOD THEREOF

[75] Inventor: Masahiko Akiyama, Tokyo, Japan

[73] Assignee: Kabushiki Kaisha Toshiba, Kanagawa-ken, Japan

[21] Appl. No.: 158,825

[22] Filed: Nov. 26, 1993

[30] Foreign Application Priority Data

Nov. 27, 1992 [JP] Japan .................................. 4-318895

[51] Int. Cl.$^6$ .................................................. H01L 29/04
[52] U.S. Cl. ............................. 257/57; 257/61; 257/347
[58] Field of Search ............................. 257/57, 59, 61, 257/72, 347, 382

[56] References Cited

U.S. PATENT DOCUMENTS 4,864,376  9/1989  Aoki et al. ................................. 257/435

FOREIGN PATENT DOCUMENTS 61-224359  10/1986  Japan .
1-183854   7/1989   Japan .

Primary Examiner—Mark V. Prenty
Attorney, Agent, or Firm—Finnegan, Henderson, Farabow, Garrett & Dunner, L.L.P.

[57] ABSTRACT

A thin film transistor is disclosed, which comprises a transparent insulating substrate, a gate electrode formed over the transparent insulating substrate, a gate insulating layer formed over the gate electrode in such a way that the gate electrode is overlaid with the gate insulating layer, a semiconductor layer having a source region, a drain region, and a channel region, the source region having an ohmic contact portion at least on the front surface thereof, the drain region having an ohmic contact portion at least on the front surface thereof, the ohmic contact portion being doped with impurities, the channel region being formed between the source region and the drain region, a source electrode made of a transparent electrical conductive film, the source electrode being disposed on the front surface of the source region, the source electrode being ohmic contacted to the front surface of the source region, and a drain electrode made of a transparent electrical conductive film, the drain electrode being disposed on the front surface of the drain region, the drain electrode being ohmic contacted to the front surface of the drain region.

5 Claims, 15 Drawing Sheets

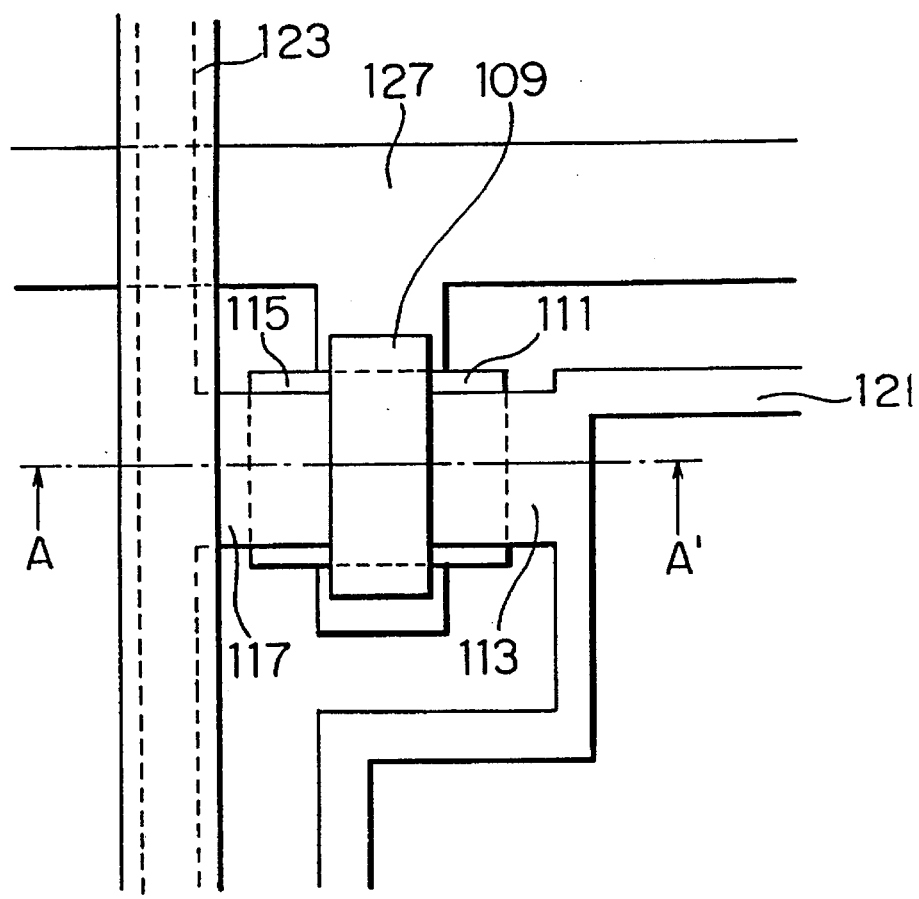
FIG. I(a)
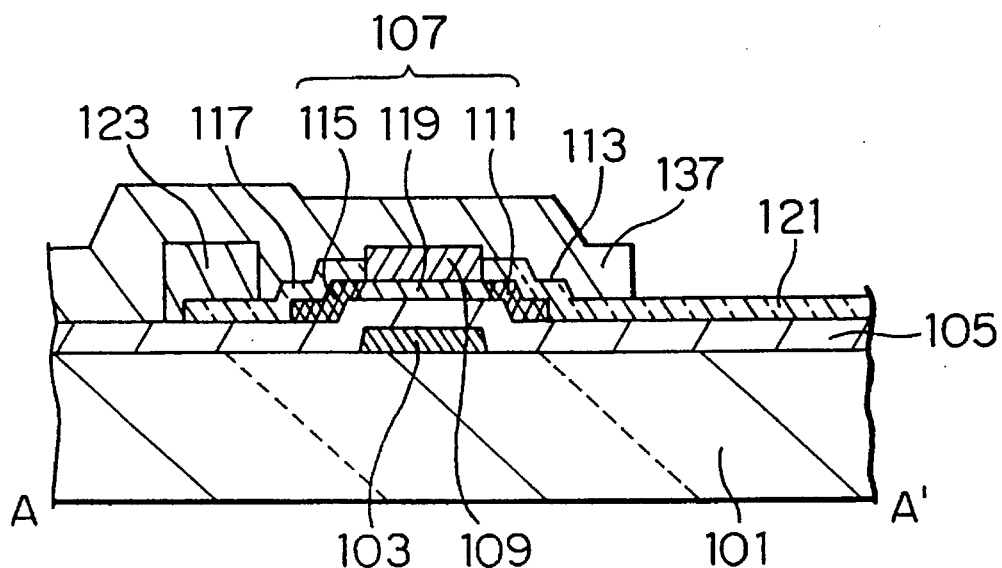
FIG. I(b)

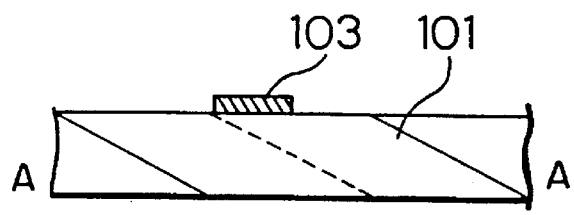
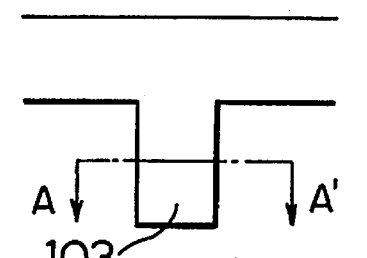
FIG. 2(a)  FIG. 2(a')
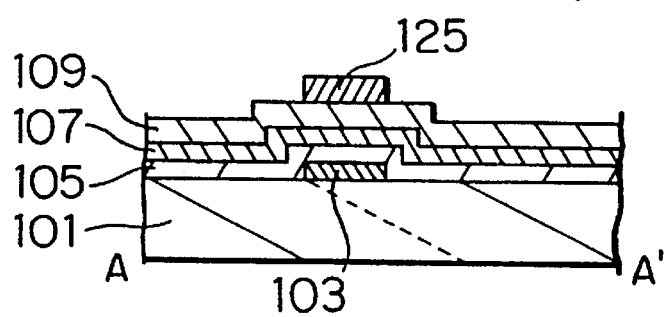
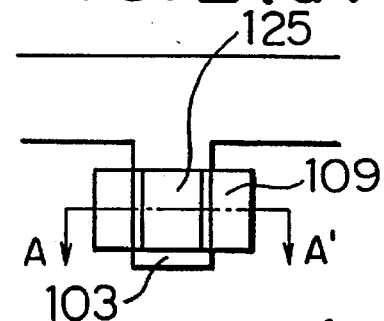
FIG. 2(b)  FIG. 2(b')
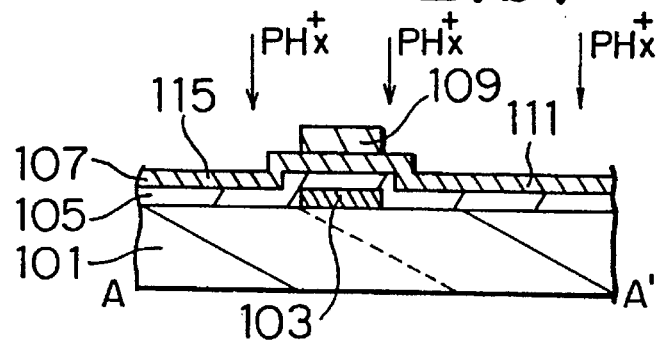
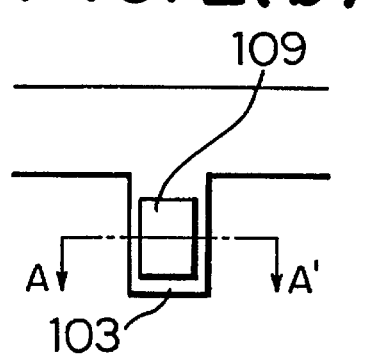
FIG. 2(c)  FIG. 2(c')
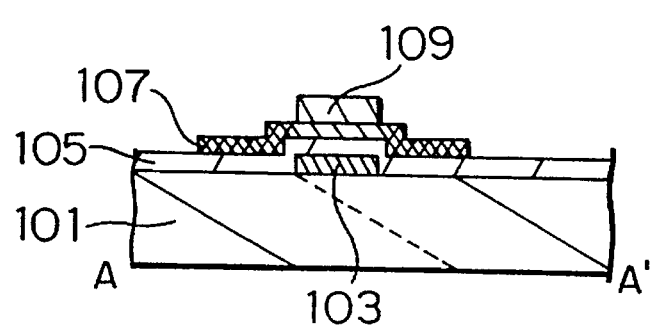
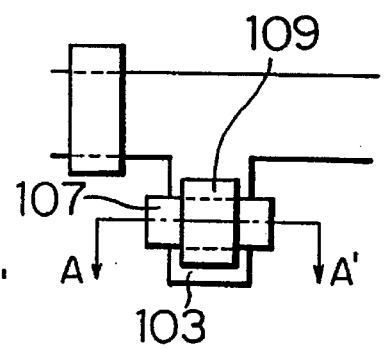
FIG. 2(d)  FIG. 2(d')

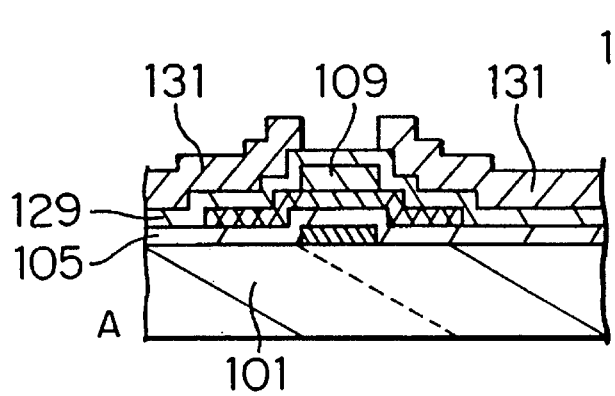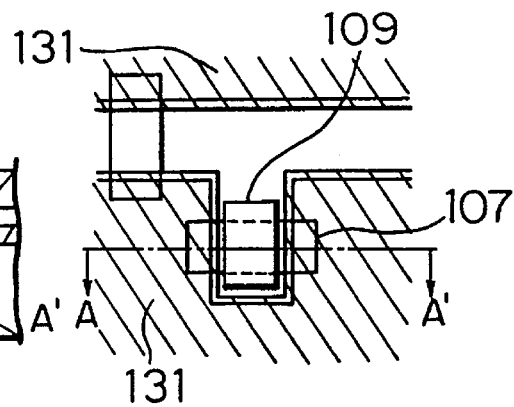
FIG. 3(e)    FIG. 3(e')
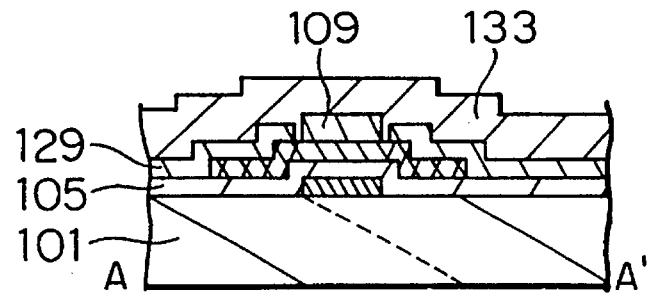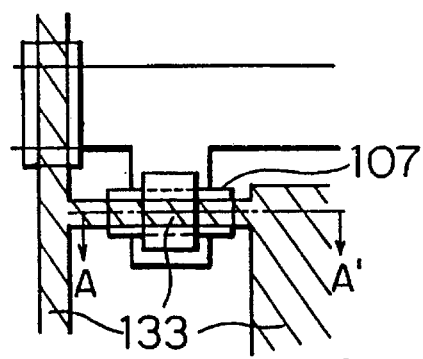
FIG. 3(f)    FIG. 3(f')
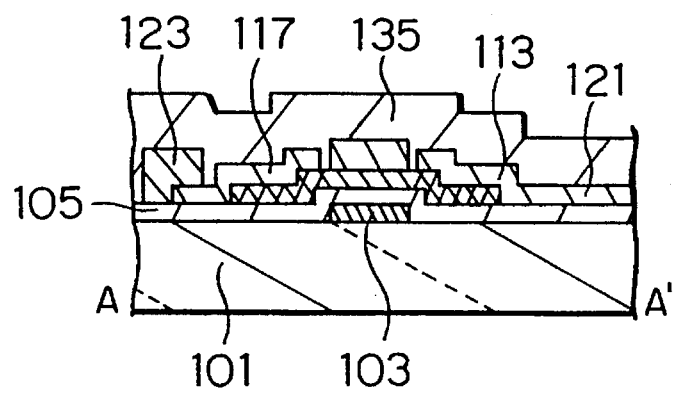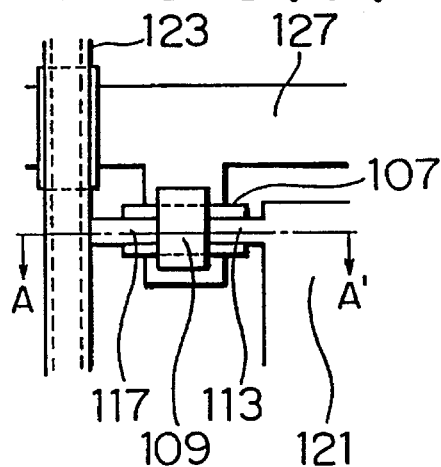
FIG. 3(g)    FIG. 3(g')

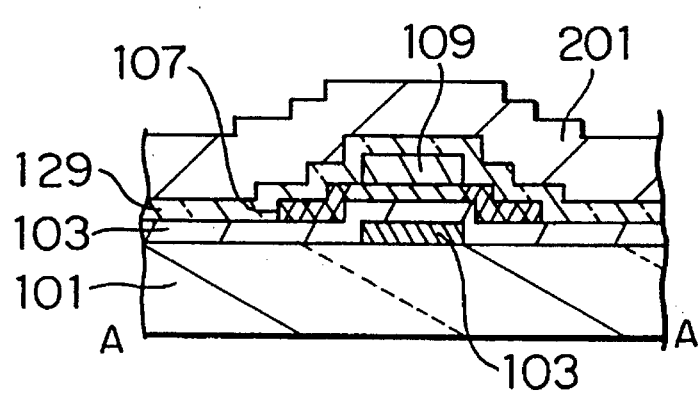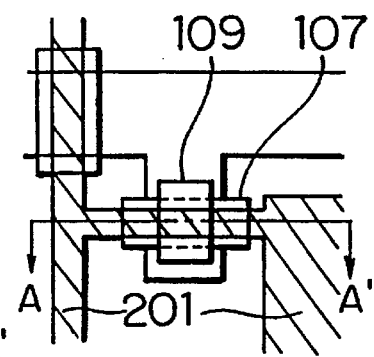
FIG. 4(a)  FIG. 4(a')
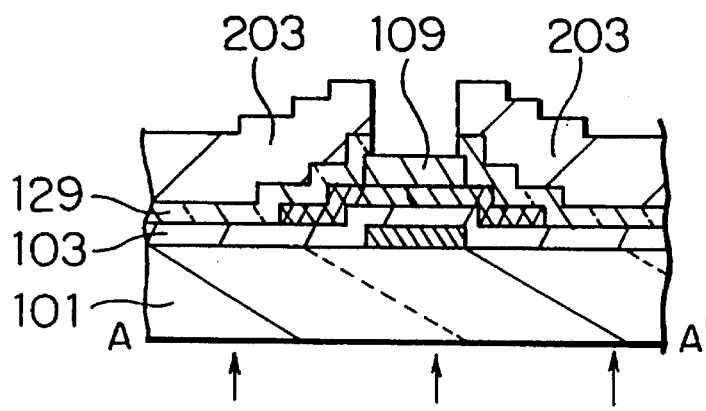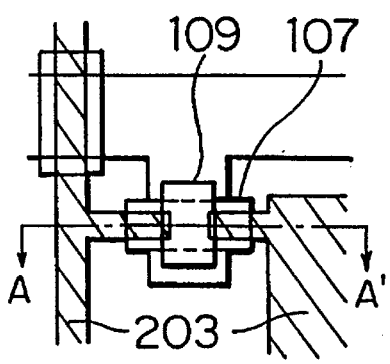
FIG. 4(b)  FIG. 4(b')

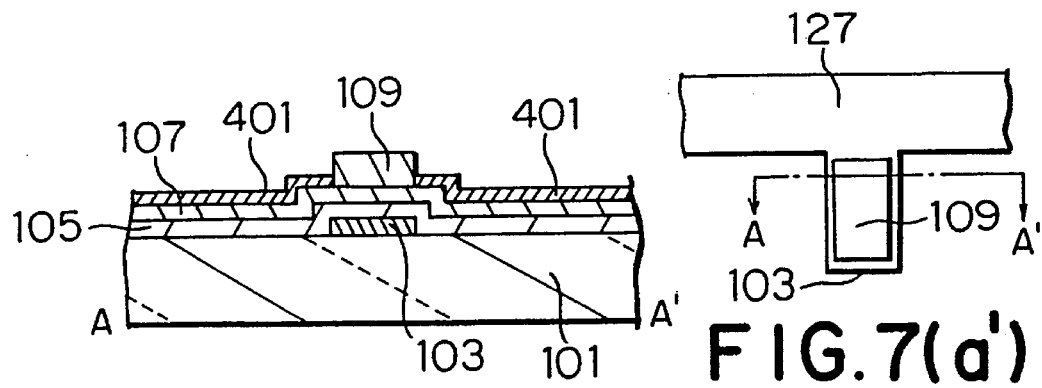
FIG. 7(a) FIG. 7(a')
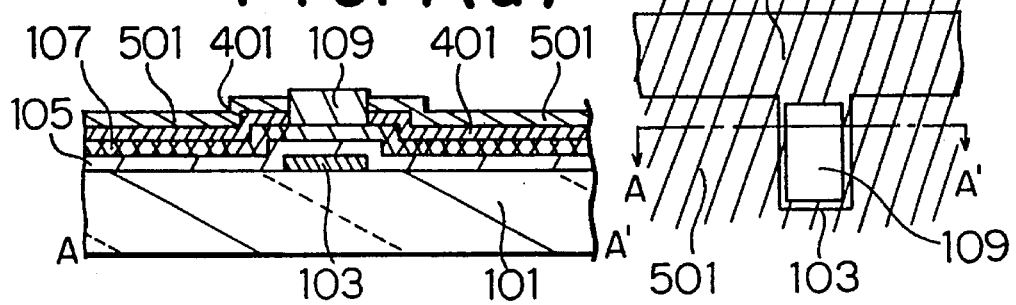 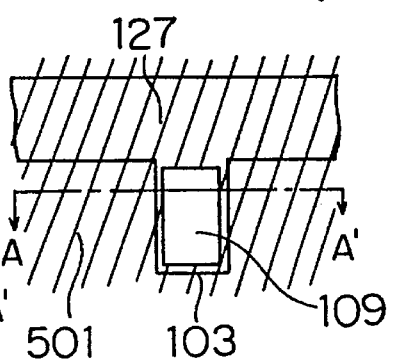
FIG. 7(b) FIG. 7(b')
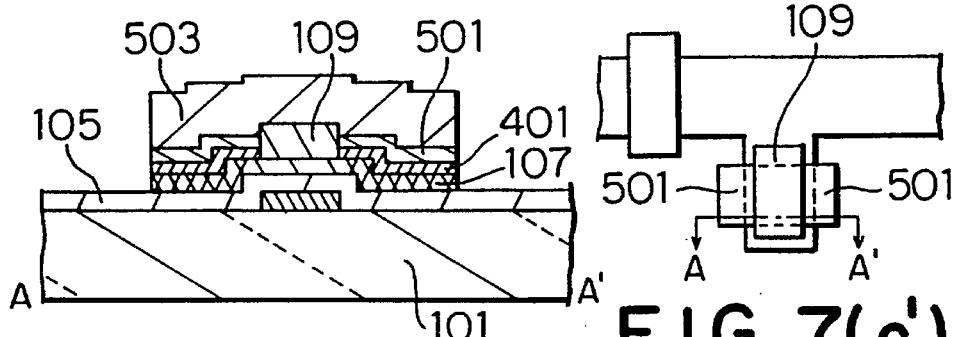
FIG. 7(c) FIG. 7(c')
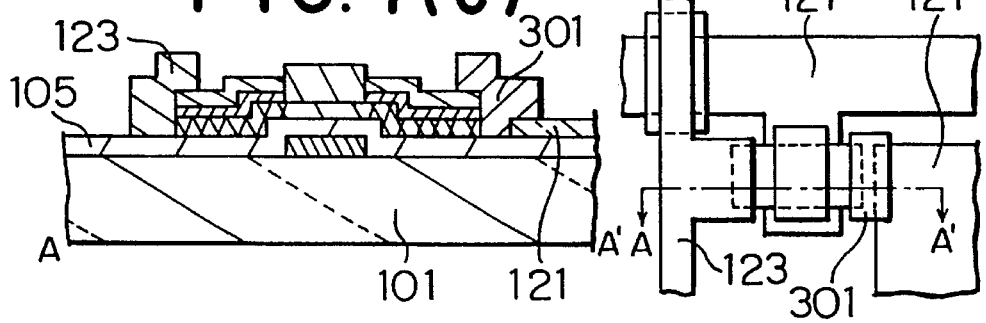 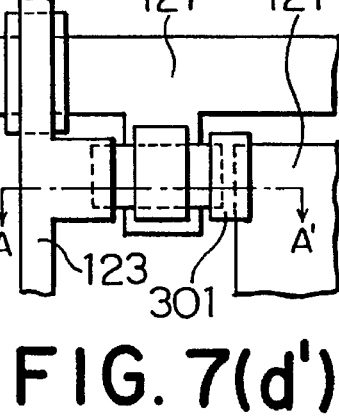
FIG. 7(d) FIG. 7(d')

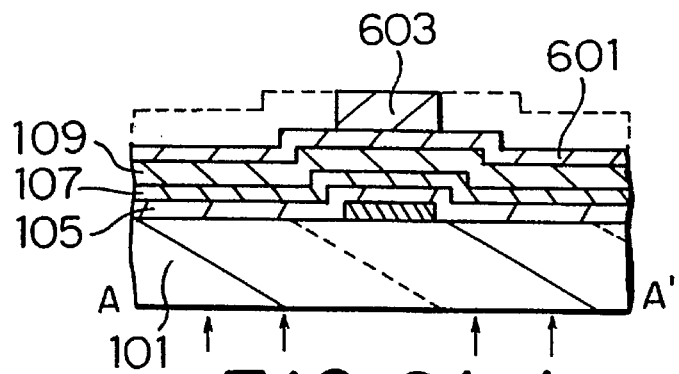 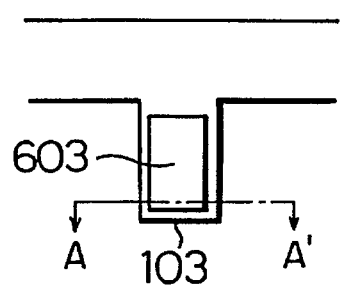
FIG. 8(a)   FIG. 8(a')
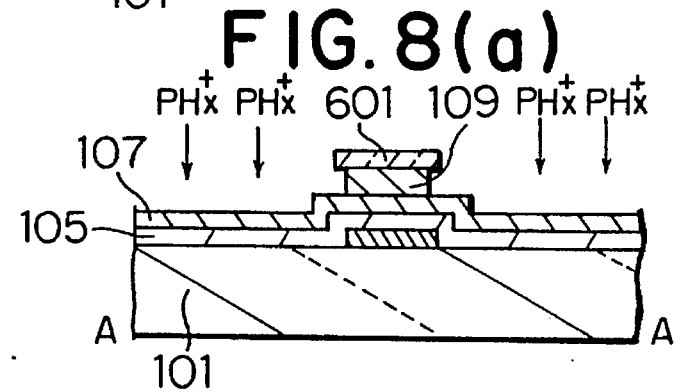 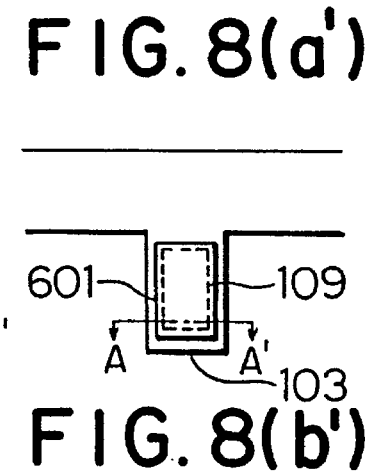
FIG. 8(b)   FIG. 8(b')
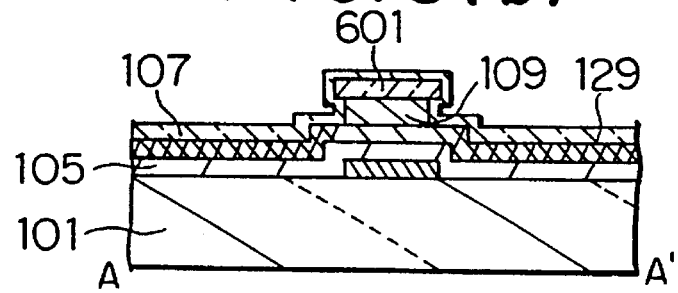 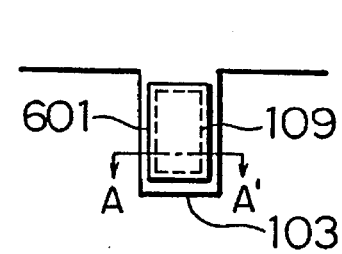
FIG. 8(c)   FIG. 8(c')
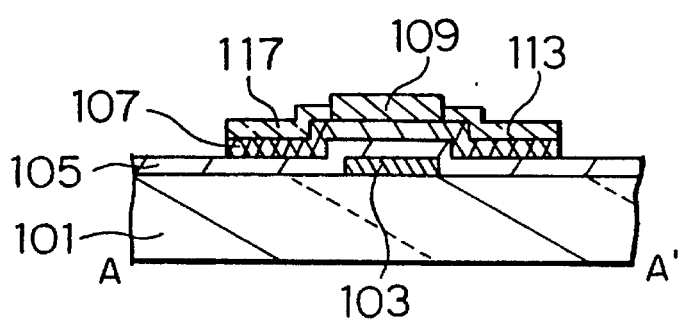 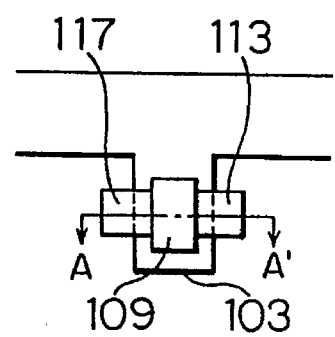
FIG. 8(d)   FIG. 8(d')

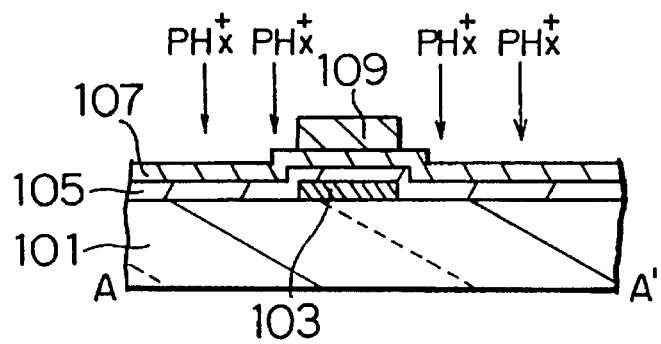 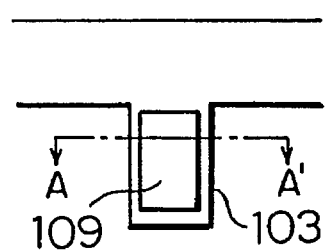
FIG.9(a)  FIG.9(a')
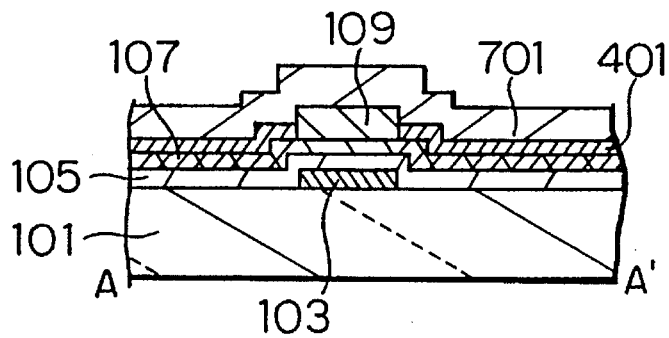 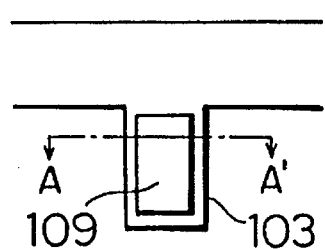
FIG.9(b)  FIG.9(b')
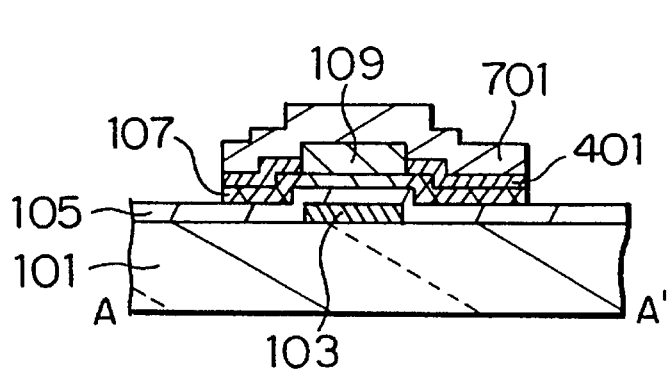 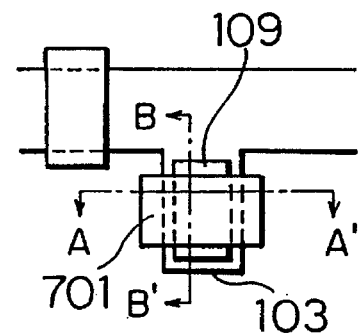
FIG.9(c)  FIG.9(c')
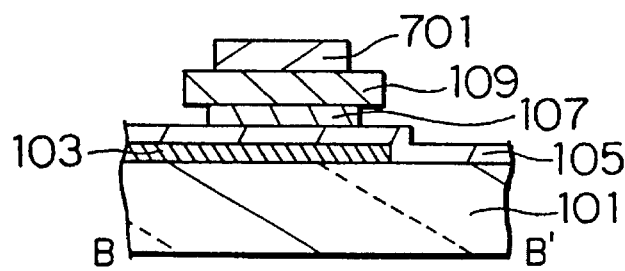
FIG.9(c")

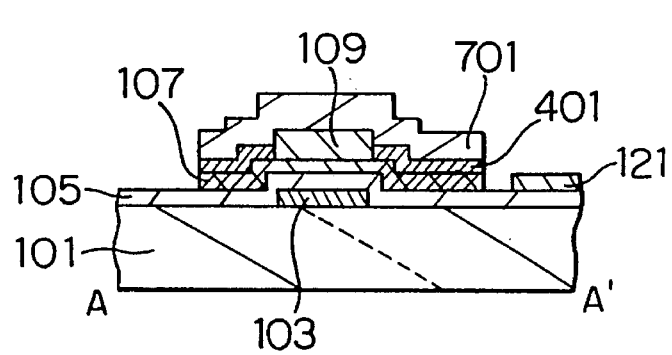
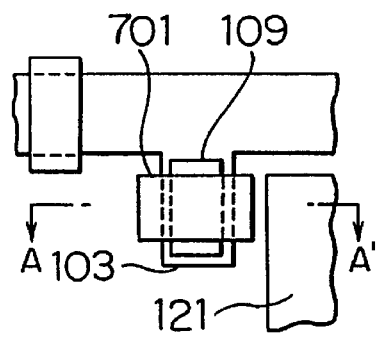
FIG.10(d)   FIG.10(d')
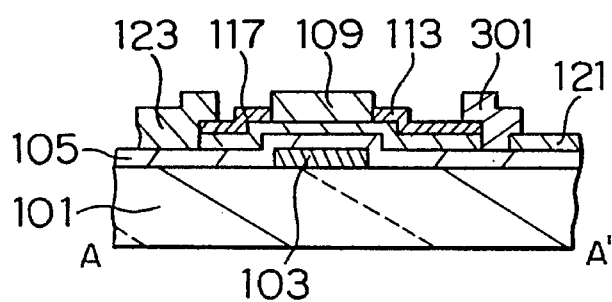
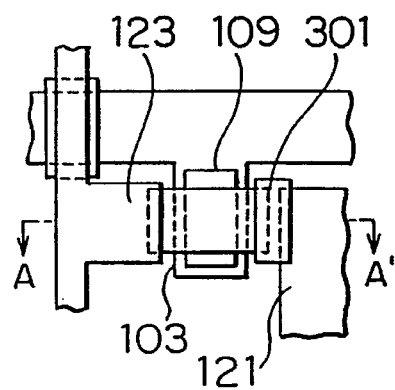
FIG.10(e)   FIG.10(e')

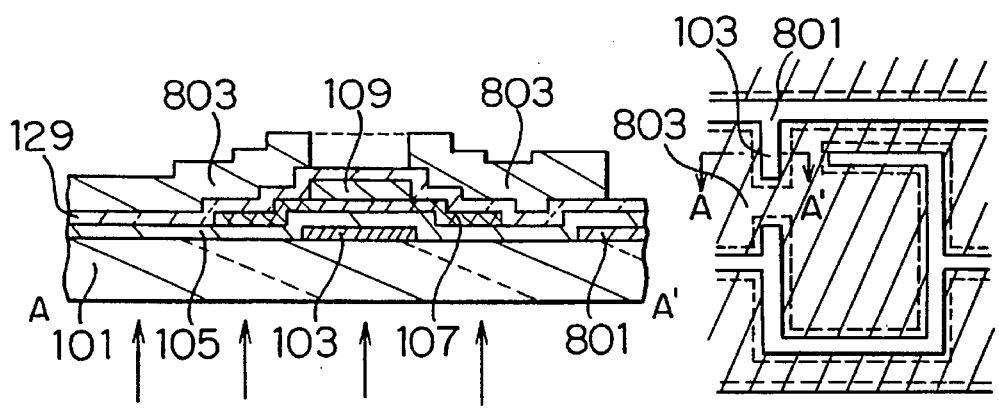
FIG.11(a)   FIG.11(a')
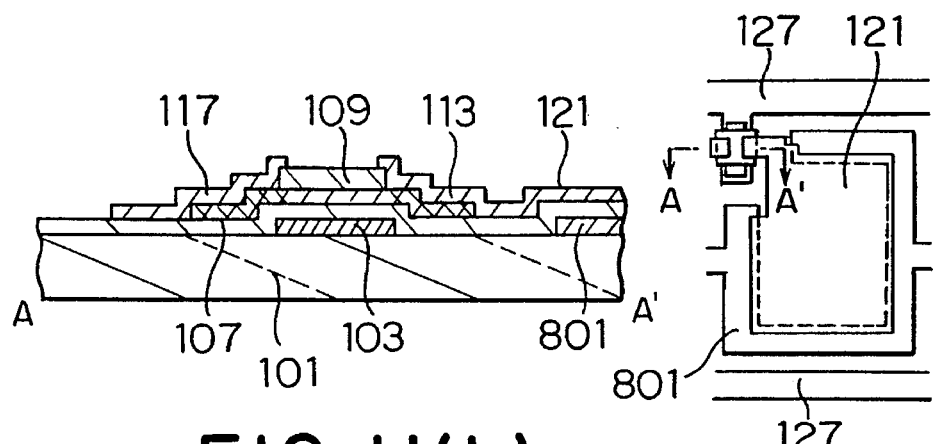
FIG.11(b)   FIG.11(b')
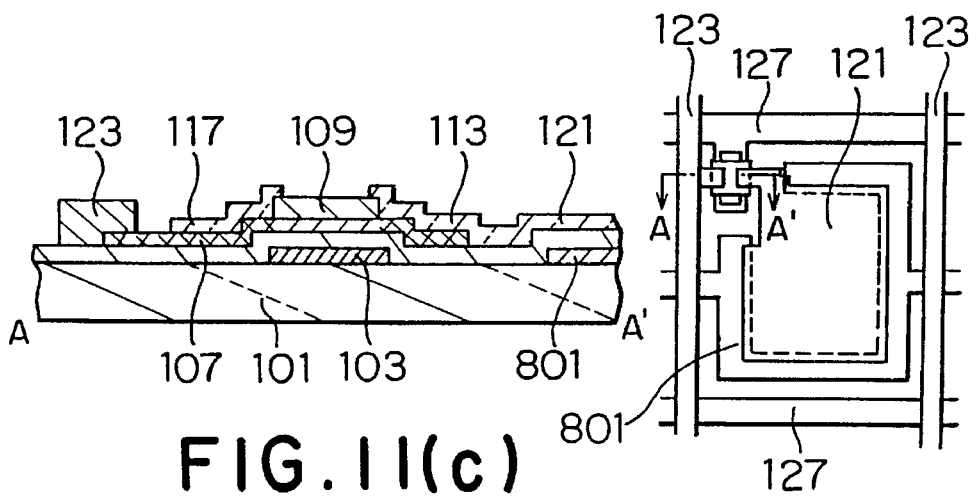
FIG.11(c)   FIG.11(c')

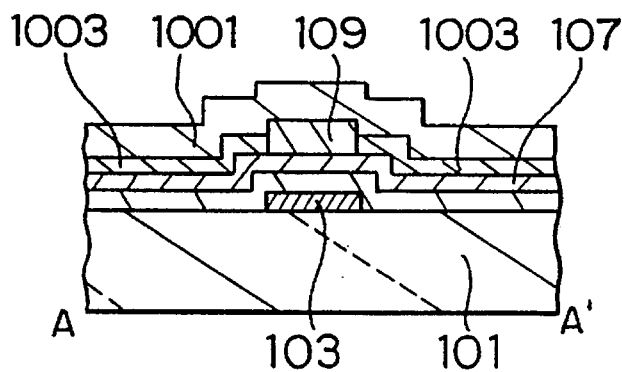
FIG.13(a)
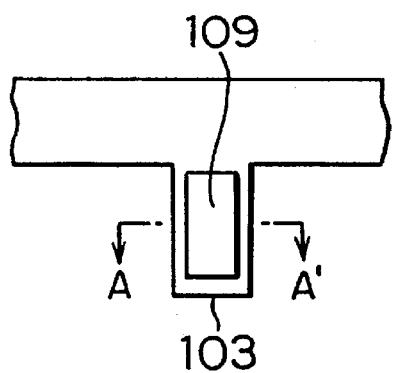
FIG.13(a')
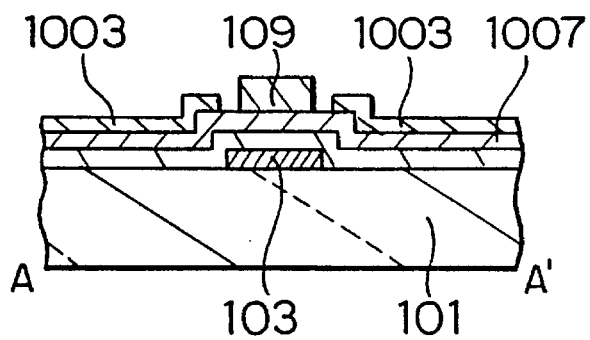
FIG.13(b)
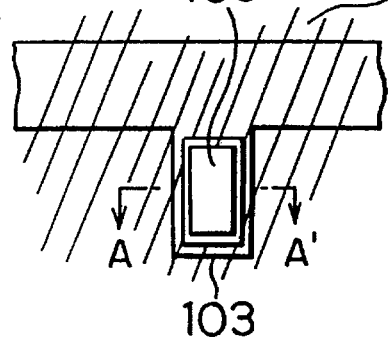
FIG.13(b')
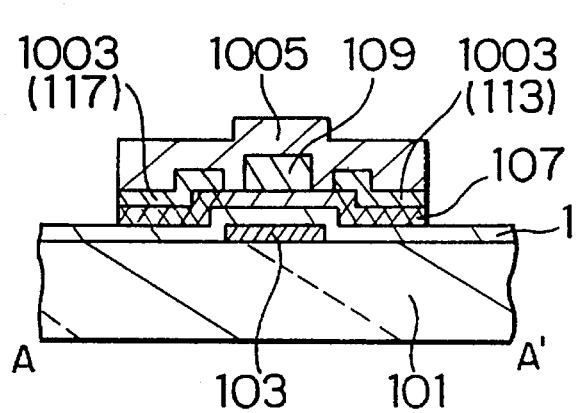
FIG.13(c)
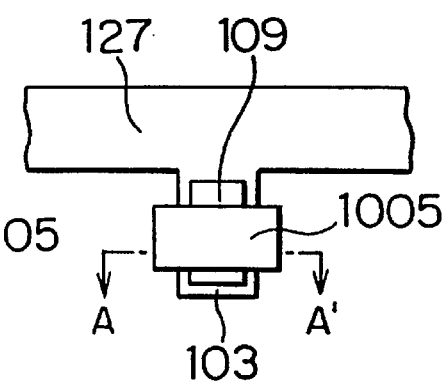
FIG.13(c')

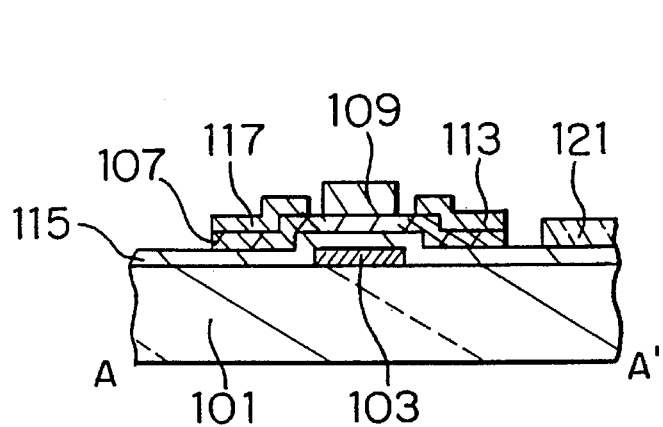
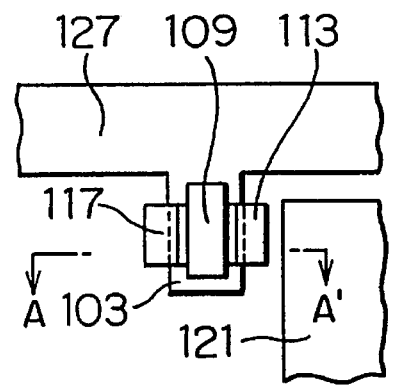
F I G. 14(d)    F I G. 14(d')
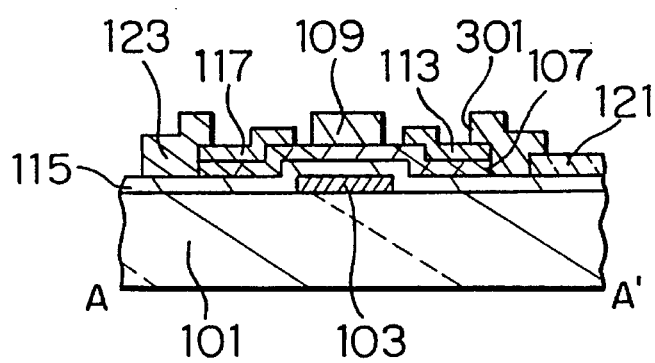
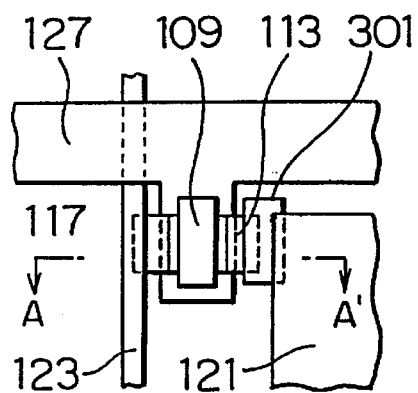
F I G. 14(e)    F I G. 14(e')
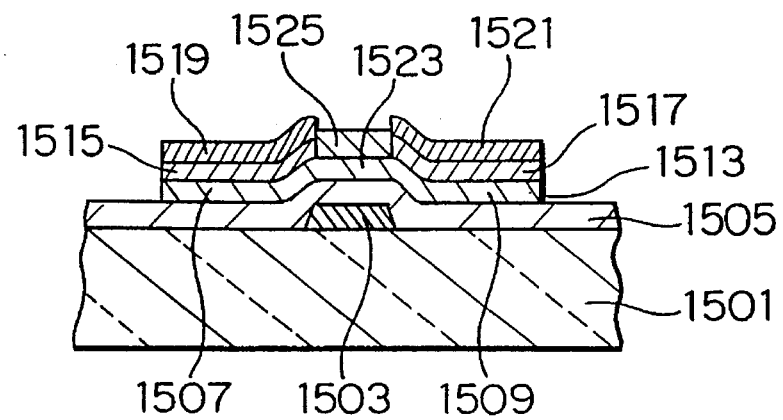
F I G. 15

THIN FILM TRANSISTOR AND FABRICATION METHOD THEREOF

BACKGROUND OF THE INVENTION

1. Field of the Invention

The present invention relates to a thin film transistor and a fabrication method thereof.

2. Description of the Related Art

Amorphous silicon thin film transistors (hereinafter referred to as a-Si TFT) are well known as pixel switching transistors devices for use with active matrix type liquid crystal display (LCD) devices and as transistor devices which construct LCD device driver circuits integrally formed on array substrates.

In particular, active matrix type LCD devices having a-Si TFTs are preferably used for display devices such as projector type LCD devices as well as LCD type TV sets and OA devices.

FIG. 15 shows the construction of an example of a related art bottom-gate staggered a-Si TFT.

Referring to FIG. 15, the a-Si TFT comprises a transparent insulating substrate 1501, a gate electrode 1503, a gate insulating layer 1505, a semiconductor layer 1513, a source region ohmic contact layer 1515, a drain region ohmic contact layer 1517, a source electrode 1519, a source electrode 1521, and a channel-stopper insulator layer 1525. The gate electrode 1503 is formed over the transparent insulating substrate 1501. The gate insulating layer 1505 is formed over the gate electrode 1503 in such a way that the gate electrode 1503 is overlaid with the gate insulating layer de1505. The semiconductor layer 1513 is formed over the gate insulating layer 1505. The semiconductor layer 1513 having a source region 1507, a drain region 1509, and a channel region 1511 which is disposed therebetween. The source region ohmic contact layer 1515 is formed over the source region 1507. The drain region ohmic contact layer 1517 is formed over the drain region 1509. The source electrode 1519 is formed over the source region ohmic contact layer 1515 so that they are ohmic contacted with each other. The source electrode 1521 is formed over the drain region ohmic contact layer 1517 so that they are ohmic contacted with each other. The channel-stopper insulator layer 1525 is formed over a channel region 1523 of the semiconductor layer 1513.

When an a-Si TFT is used for a projector type LCD device where strong light is entered by a light source, a light insulating film which is named a black-matrix is disposed on the rear surface of the transparent insulating substrate 1501. Or disposed on the front surface of the transparent insulating substrate opposed to the transparent insulating substrate 1501.

This light insulating film prevents light from entering the channel region 1523 of the a-Si TFT so as to suppress occurrence of an optical leak current.

However, as the size of pixels of the projector type LCD device decreases, reflected light in liquid crystal cells causes an optical leak current to take place in the thin film transistor. The optical leak current results in malfunction of the LCD device.

Particularly, in the above-described bottom-gate staggered a-Si TFT, since the source electrode, the drain electrode, and the ohmic contact layer are not largely spaced apart from the channel region, reflected light which takes place at such electrodes and layer much affect the channel region, thereby causing an optical leak current to take place in the TFT. Thus, the TFT will malfunction.

On the other hand, it is known that such an a-Si TFT is preferably fabricated by self-alignment method. Among various constructions and fabrication methods of a-Si TFTs, a self-alignment type a-Si TFT has the following advantages over the other types of a-Si TFTs.

(1) Occurrence of parasitic capacitance due to overlapping of the gate electrode and source region/drain region can be prevented.

(2) On the fabrication stage, the gate electrode and the source region/drain region are self aligned. Thus, the a-Si TFT can be easily fabricated without necessity of precise alignment control.

(3) From (1) and (2), when the a-Si TFT is used for a LCD device, since the electrostatic capacitance for each gate electrode decreases, it can operate with high speed signals. In addition, since the alignment less deviates, parasitic capacitance (Cgs) between the gate electrode and the source electrode less deviates. Thus, when an LCD device with a large display area is formed, a feed-through voltage caused by gate pulses in pixel electrodes can be restricted. The countermeasures against display failure due to the feed-through voltage can be simplified.

The a-Si TFT shown in FIG. 15 is an example of the above-mentioned self alignment type a-Si TFT. In the a-Si TFT shown in FIG. 15, an n type a-Si layer and an electrode layer are formed over a positive-type photoresist (which has been patterned and deposited over the gate electrode by back-side exposure technique) by CVD method or the like. A pattern is formed by lift-off method or the like. FIG. 16 shows the construction of another example of a-Si TFT. This a-Si TFT is fabricated in the following manner. A metal film (such as Al film) for a source electrode and a drain electrode is reacted with an a-Si film over a semiconductor layer 1513 made of n type a-Si doped by ion implantation method. Thus, a silicide film 1601 is formed.

The specific resistance of the n type a-Si layer of a-Si TFT on which the source region and drain region are formed is approximately $10^2$ Ω-cm. The sheet resistance of the n type a-Si layer with a thickness of 500 angstroms is $2 \times 10^7$ Ω/□. Thus, the electric resistance of the n type a-Si layer is very high. To lower the resistance, in the a-Si TFT, the n type a-Si layer is often used as an ohmic contact layer. An electrode layer made of a conductor (such as a metal) is deposited over the n type a-Si layer so as to lower the resistance.

However, in the a-Si TFT having an ohmic contact layer which is a deposited n type a-Si layer or the like, when a photoresist used for etching out a channel-stopper insulator layer is patterned by back-side exposure technique, the transmittance of light of the ohmic contact layer is insufficient. Thus, the exposure of the photoresist is insufficient. In addition, the exposure process takes a long time and developing conditions become strict. Consequently, the yield and throughput on fabrication stage are deteriorated.

When the ohmic contact layer and the electrode layer are patterned by lift-off method, incomplete lift-off takes place, thereby deteriorating the yield.

To solve such a problem, an electrode forming method using a silicide has been proposed.

However, when a silicide is thinly formed, the resistance becomes unstable. In contrast, when a silicide is thickly formed, it erodes the channel region of the thin a-Si, thereby deteriorating the characteristics of the TFT. In addition, when the electrode layer is formed of a silicide, an off-current may sometimes increase.

Thus, an electrode layer is not easily formed of a silicide.

The present invention has been made to solve such problems. An object of the present invention to provide a thin film transistor (TFT) which is used in a projector type LCD device and the like, which does not deteriorate the yield and throughput on the fabrication stage, and which restricts an photo leak current caused by reflected light at a source electrode, a drain electrode, and an ohmic contact layer.

SUMMARY OF THE INVENTION

A first aspect of the present invention is a thin film transistor, comprising: a transparent insulating substrate; a gate electrode formed over said transparent insulating substrate; a gate insulating layer formed over said gate electrode in such a way that said gate electrode is overlaid with said gate insulating layer; a semiconductor layer formed on said gate insulating layer, having a source region, a drain region, and a channel region, said source region being doped with impurities having an ohmic contact portion at least on the front surface thereof, said drain region being doped with impurities having an ohmic contact portion at least on the front surface thereof, said channel region being formed between said source region and said drain region; a source electrode made of a transparent electrical conductive film, said source electrode being disposed on the front surface of said source region, said source electrode being ohmic contacted to the front surface of said source region; and a drain electrode made of a transparent electrical conductive film, said drain electrode being disposed on the front surface of said drain region, said drain electrode being ohmic contacted to the front surface of said drain region.

A second aspect of the present invention is the thin film transistor of the first aspect, further comprising a first silicide layer formed on the front surface of the semiconductor layer where the transparent electrical conductive film is in contact with the source region, and a second silicide layer formed on the front surface of the semiconductor layer where the transparent electrical conductive film is in contact with the drain region.

A third aspect of the present invention is a fabrication method of a thin film transistor, comprising the steps of (a) forming a gate electrode over a first principal surface of a transparent insulating substrate, (b) forming a gate insulating layer over the gate electrode in such a way that the gate electrode is overlaid with the gate insulating layer, (c) forming a semiconductor layer over the gate insulating layer, (d) forming a channel-stopper insulator layer over the semiconductor layer, (e) doping impurities in a portion of the semiconductor layer exposed from the channel-stopper insulator layer so as to form a source region and a drain region, each of which has an ohmic contact portion at least on the front surface thereof and so as to form a channel region with a portion of the semiconductor layer overlaid with the channel-stopper insulator layer, (f) forming a transparent electrical conductive film over at least the channel-stopper insulator layer, the source region, and the drain region in such a way that the channel-stopper insulator layer, the source region, and the drain region are overlaid with the transparent electrical conductive film, (g) forming a negative-type photoresist over at least the transparent electrical conductive film, (h) irradiating light to a second principal surface of the transparent insulating substrate so as to expose the negative-type photoresist by back exposure technique and to form a photoresist pattern, and (i) patterning the transparent electrical conductive film corresponding to the photoresist pattern so as to form a source electrode and a drain electrode over the front surfaces of the source region and the drain region, respectively.

A fourth aspect of the present invention is the fabrication method of the thin film transistor of the third aspect, further comprising the step of (a') forming a silicide layer over the source region and the drain region of the semiconductor layer, wherein the step (a') is preceded by the step (e).

A fifth aspect of the present invention is a fabrication method of a thin film transistor, comprising the steps of (a) forming a gate electrode over a first principal surface of a transparent insulating substrate, (b) forming a gate insulating layer over the gate electrode in such a way that the gate electrode is overlaid with the gate insulating layer, (c) forming a semiconductor layer over the gate insulating layer, (d) forming a channel-stopper insulator layer over the semiconductor layer, (e) applying mixed plasma of hydrogen ions and impurity ions or plasma of a substance containing hydrogen atoms and impurity atoms to a portion of the semiconductor layer exposed from the stopper insulator so as to form a source region and a drain region, each of which has an ohmic contact portion at least on the front surface thereof and so as to form a channel region with a portion of the semiconductor layer overlaid with the channel-stopper insulator layer, (f) forming a transparent electrical conductive film over at least the channel-stopper insulator layer, the source region, and the drain region in such a way that the channel-stopper insulator layer, the source region, and the drain region are overlaid with the transparent electrical conductive film, (g) forming a negative-type photoresist over at least the transparent electrical conductive film, (h) irradiating light to a second principal surface of the transparent insulating substrate so as to expose the negative-type photoresist by back-side exposure technique and to form a photoresist pattern, and (i) patterning the transparent electrical conductive film corresponding to the photoresist pattern so as to form a source electrode and a drain electrode over the front surfaces of the source region and the drain region, respectively.

A sixth aspect of the present invention is the fabrication method of the thin film transistor of the fifth aspect, further comprising the step of (a') forming a silicide layer over the source region and the drain region of the semiconductor layer, wherein the step (a') is preceded by the step (e).

A seventh aspect of the present invention is the fabrication method of the thin film transistor of the third, fourth, fifth, or sixth aspect, further comprising the step of (a") selectively forming a source electrode and a drain electrode respectively over the source region and the drain region by chemical plating method, wherein the step (a") is preceded by the step (e).

An eighth aspect of the present invention is a thin film transistor, comprising an insulating substrate, a gate electrode formed over the insulating substrate, a gate insulating layer formed over the gate electrode in such a way that the gate electrode is overlaid with the gate insulating layer, a semiconductor layer having a source region, a drain region, and a channel region, the source region having an ohmic contact portion at least on the front surface thereof, the drain region having an ohmic contact portion at least on the front surface thereof, the ohmic contact portion being doped with impurities, the channel region being formed between the source region and the drain region, and a channel-stopper insulator layer formed over the channel region, the width of the channel-stopper insulator layer being wider than the channel width of the channel region of the semiconductor layer.

A ninth aspect of the present invention is the thin film transistor of the eighth aspect, further comprising a first silicide layer formed on the front surface of the source region, and a second silicide layer formed on the front surface of the drain region.

A tenth aspect of the present invention is the thin film transistor of the eighth aspect, wherein side walls in a channel lateral direction of the channel-stopper insulator layer is oxidized.

An eleventh aspect of the present invention is a fabrication method of a thin film transistor, comprising the steps of (a) forming a gate electrode over an insulating substrate, (b) forming a gate insulating layer over the gate electrode in such a way that the gate electrode is overlaid with the gate insulating layer, (c) forming a semiconductor layer over the gate insulating layer, (d) doping impurities in the semiconductor layer so as to form a source region and a drain region, each of which has an ohmic contact portion at least on the front surface thereof and to form a channel region between the source region and the drain region, (e) forming an insulating film over the channel region, (f) selectively etching out the insulating film and the semiconductor layer in such a way that the semiconductor layer is more etched out than the insulating film so as to form a channel-stopper insulator layer which is wider than the channel width of the channel region, (g) patterning the semiconductor layer in an island shape, and (h) oxidizing side walls in a channel lateral direction of the semiconductor layer.

A twelfth aspect of the present invention is the fabrication method of the thin film transistor of the eleventh aspect, further comprising the steps of (a') forming a metal layer made of an Ni-Mo alloy or a laminate of Ni and Mo over the semiconductor layer in such a way that the semiconductor layer is overlaid with the metal layer so as to form a silicide layer over the front surface of the semiconductor layer, wherein the step (a') is preceding by the step (c).

A thirteenth aspect of the present invention is the fabrication method of the thin film transistor as set forth in the twelfth aspect, wherein said metal layer is a Ni-Mo alloy or a laminate of Ni and Mo.

A fouthirteenth aspect of the present invention is a thin film transistor, comprising an insulating substrate, a gate electrode formed over the insulating substrate, a gate insulating layer formed over the gate electrode in such a way that the gate electrode is overlaid with the gate insulating layer, a semiconductor layer having a source region, a drain region, and a channel region, the source region having an ohmic contact portion at least on the front surface thereof, the drain region having an ohmic contact portion at least on the front surface thereof, the ohmic contact portion being doped with impurities, the channel region being formed between the source region and the drain region, and a channel-stopper insulator layer formed over the channel region, the width of the channel-stopper insulator layer being wider than the channel width of the channel region of the semiconductor layer, the ohmic contact portion of the source region being spaced apart from the ohmic contact portion of the drain region.

A fifteenth aspect of the present invention is the thin film transistor of the fourteenth aspect, further comprising a first silicide layer formed on the front surface of the source region, and a second silicide layer formed on the front surface of the drain region.

A sixteenth aspect of the present invention is a fabrication method of a thin film transistor, comprising the steps of (a) forming a gate electrode over a principal surface of an insulating substrate, (b) forming a gate insulating layer over the gate electrode in such a way that the gate electrode is overlaid with the gate insulating layer, (c) forming a semiconductor layer over the gate insulating layer in such a way that the gate insulating layer is overlaid with the semiconductor layer, (d) forming a channel-stopper insulator layer over the semiconductor layer, (e) forming a silicide layer over the front surface of a portion of the semiconductor layer exposed from the channel-stopper insulator layer, (f) etching out side walls of the channel-stopper insulator layer so that side walls of the silicide layer are spaced apart from the side walls of the channel-stopper insulator layer, and (g) doping impurities in a portion of the semiconductor layer exposed from the channel-stopper insulator layer so as to form a source region and a drain region, each of which has an ohmic contact portion at least on the front surface thereof.

A seventeenth aspect of the present invention is the fabrication method of the thin film transistor of the sixteenth aspect, further comprising the steps of (a') forming a silicide layer over a portion exposed from the channel-stopper insulator layer, and (b') doping impurities in the silicide layer and the semiconductor layer, wherein the steps (a') and (b') are preceded by the step (d).

A eighteenth aspect of the present invention is the fabrication method of the thin film transistor of the sixteenth aspect, further comprising the steps of (a') forming a metal layer made of an Ni-Mo alloy or a laminate of Ni and Mo over a portion of the semiconductor layer exposed from the channel-stopper insulator layer in such a way that the exposed portion is overlaid with the metal layer so as to form a silicide layer over the front surface of the semiconductor layer, (b') doping impurities in the silicide layer and the semiconductor layer, wherein the steps (a') and (b') are preceded by the step (d).

An nineteenth aspect of the present invention is the fabrication method of the thin film transistor of the eleventh, twelfth, sixteenth, seventeenth, or eighteenth aspect, further comprising the step of (a") selectively forming a source electrode and a drain electrode respectively over the source region and the drain region by chemical plating method, wherein the step (a") is preceded by the step for forming the source region an the drain region over the semiconductor layer.

According to the first and second aspects of the present invention, impurities are doped at least onto the front surfaces of a source region and a drain region of the semiconductor layer so as to form ohmic contact portions. Thus, an ohmic contact layer which was independently formed over a semiconductor layer of a related art TFT can be omitted. Consequently, a photo leak current which took place due to reflected light by the ohmic contact layer can be prevented. In addition, since a source electrode and a drain electrode are made of a transparent electrical conductive film, the source electrode and the drain electrode do not reflect light. Moreover, since the ohmic contact layer is omitted on fabrication stage, the yield and throughput are improved. In addition to the omission of the ohmic contact layer, since the source electrode and the drain electrode are made of a transparent electrical conductive film, when back-side exposure process is performed for a photoresist coated over a transparent electrical conductive film, light easily passes to the photoresist. Thus, the yield and throughput on the fabrication stage are improved.

According to the third to sixth aspects of the present invention, which are fabrication methods of thin film transistors of the first and second aspects, when a semiconductor layer is doped from a plasma which is a mixture of impurity ions (such as phosphorus ions) and hydrogen ions and ions of compounds formed from hydrogen atoms and impurity atoms, the thin film transistor of the first aspect of the present invention can be fabricated. In the neighborhood of the front surface of the semiconductor layer, hydrogen ions are doped. On the other hand, in a deeper portion of the semiconductor layer, impurity ions (such as phosphorus ions) are doped and thereby the resistance of this portion becomes low. In this portion, a source region and a drain region can be formed. When a transparent electrical conductive film made of indium tin oxide (ITO) is formed over the source region and the drain region and they are directly contacted, the transparent electrical conductive film is reduced by the hydrogen ions doped and thereby ohmic contact portions are formed in the neighborhood of the front surface of the semiconductor layer. Thus, with one plasma doping step, the source region, the drain region, and the ohmic contact portions can be formed. Consequently, the fabrication process can be simplified.

The negative-type photoresist exposure is not limited to the back-side exposure. Instead, the front-side exposure may be performed with a photomask at the same time.

According to the seventh aspect of the present invention, which is a fabrication method of a thin film transistor, in the fabrication methods of the thin film transistors of the third to sixth aspects, a source electrode connected to a source region and a drain electrode connected to a drain region are formed by chemical plating method. Thus, the source electrode and the drain electrode can be precisely patterned and formed over a dense material, thereby lowering the resistance of the source electrode and the drain electrode. Consequently, the thin film transistor connected to the source electrode and the drain electrode can be properly operated.

According to the eighth to twelfth aspects of the present invention, which are fabrication methods of thin film transistors, in the thin film transistors and the fabrication methods thereof of the first to seventh aspects, since a channel-stopper insulator layer which is wider than the channel width of the semiconductor layer is formed, a source electrode, a drain electrode, and ohmic contact portions are not in contact with side walls in a channel lateral direction of the semiconductor layer. Thus, since an off-current of the thin film transistor is reduced, it can be properly operated.

In addition, according to the tenth aspect of the present invention, which is a fabrication method of a thin film transistor, since the side walls in the channel lateral direction of the semiconductor layer are oxidized, the insulation of the side walls can be improved. Thus, even if a source electrode, a drain electrode, and ohmic contact portions are in contact with the side walls due to an error of the patterning process or the like, since the off current of the thin film transistor can be securely reduced, the thin film transistor can be properly operated.

Moreover, according to the twelfth aspect of the present invention, which is a fabrication method of a thin film, since a metal layer made of an alloy of Ni and Mo or a laminate of Ni and Mo is formed over a semiconductor layer, a silicide layer can be easily formed on the front surface of the semiconductor layer which is in contact with the metal layer.

According to the fourteenth and fifteenth aspects of the present invention, which are thin film transistors, since side walls of a channel-stopper insulator layer are etched out, side walls of a silicide layer are spaced apart from the side walls of the channel-stopper insulator layer so that they are not in contact with each other.

Since the side walls of the silicide layer are spaced apart from the side walls of the channel-stopper insulator layer, they can be electrically insulated from each other. Thus, an off current (a leak current in off state) of a thin film transistor can be lowered. In addition, a region with higher impurity concentration is formed in the channel-stopper insulator layer than the side walls of the silicide layer. Thus, the thin film transistor can be properly operated.

According to the sixteenth to eighteenth aspects of the present invention, which are fabrication methods of thin film transistors, in the fabrication methods of the thin film transistors of the fourteenth and fifteenth aspects, the thin film transistors with good operating characteristics can be fabricated. In particular, after a silicide layer has been formed, when impurity ions are doped in a semiconductor layer and the silicide layer, the contact resistance of the interface of the silicide layer and the semiconductor layer can be lowered. Thus, an on current due to the contact resistance does now lower. Consequently, the operating characteristics of the thin film transistor can be improved.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 1 (a) is a top view showing the construction of a TFT according to a first embodiment of the present invention;

FIG. 1 (b) is a sectional view corresponding to FIG. 1 (a);

FIGS. 2 (a) to (d) are sectional views showing fabrication steps of the TFT according to the first embodiment of the present invention;

FIGS. 2 (a') to (d') are top views corresponding to FIGS. 2 (a) to (d), respectively;

FIGS. 3 (e) to (g) are sectional views showing fabrication steps of the TFT according to the first embodiment of the present invention;

FIGS. 3 (e') to (g') are top views corresponding to FIGS. 3 (e) to (g), respectively;

FIGS. 4 (a) and (b) are sectional views showing fabrication steps of a TFT according to a second embodiment of the present invention;

FIGS. 4 (a') and (b') are top views corresponding to FIGS. 4 (a) and (b), respectively;

FIG. 5 (b) is a sectional view according to FIG. 5 (a);

FIGS. 7 (a) to (d) are sectional views showing fabrication steps of a TFT according to a fifth embodiment of the present invention;

FIGS. 7 (a') to (d') are top views corresponding to FIGS. 7 (a) to (d), respectively;

FIGS. 8 (a) to (d) are sectional views showing fabrication steps of a TFT according to a sixth embodiment of the present invention;

FIGS. 8 (a') to (d') are top views corresponding to FIGS. 8 (a) to (d), respectively;

FIGS. 9 (a) to (c) and (c") are sectional views showing fabrication steps of a TFT according to a seventh embodiment of the present invention;

FIGS. 9 (a') to (c') are top views corresponding to FIGS. 9 (a) to (c), respectively;

FIGS. 10 (d) and (e) are sectional views showing fabrication steps of the TFT according to the seventh embodiment of the present invention;

FIGS. 10 (d') and (e') are top views corresponding to FIGS. 10 (d) and (e), respectively;

FIGS. 11 (a) to (c) are sectional views showing fabrication steps of a TFT according to an eighth embodiment of the present invention;

FIGS. 11 (a') to (c') are top views corresponding to FIGS. 11 (a) to (c), respectively;

FIGS. 12 (b) and (c) are top views corresponding to FIG. 12 (a);

FIGS. 13 (a) to (c) are sectional views showing fabrication steps of a TFT according to a ten embodiment of the present invention;

FIGS. 13 (a') to (c') are top views corresponding to FIGS. 13 (a) to (c), respectively;

FIGS. 14 (d) and (e) are sectional views showing fabrication steps of the TFT according to the tenth embodiment of the present invention;

FIGS. 14 (d') and (e') are sectional views corresponding to FIGS. 14 (d) and (e), respectively;

FIG. 15 is a sectional view showing the construction of a conventional TFT; and

DESCRIPTION OF PREFERRED EMBODIMENTS

Figure 5A:
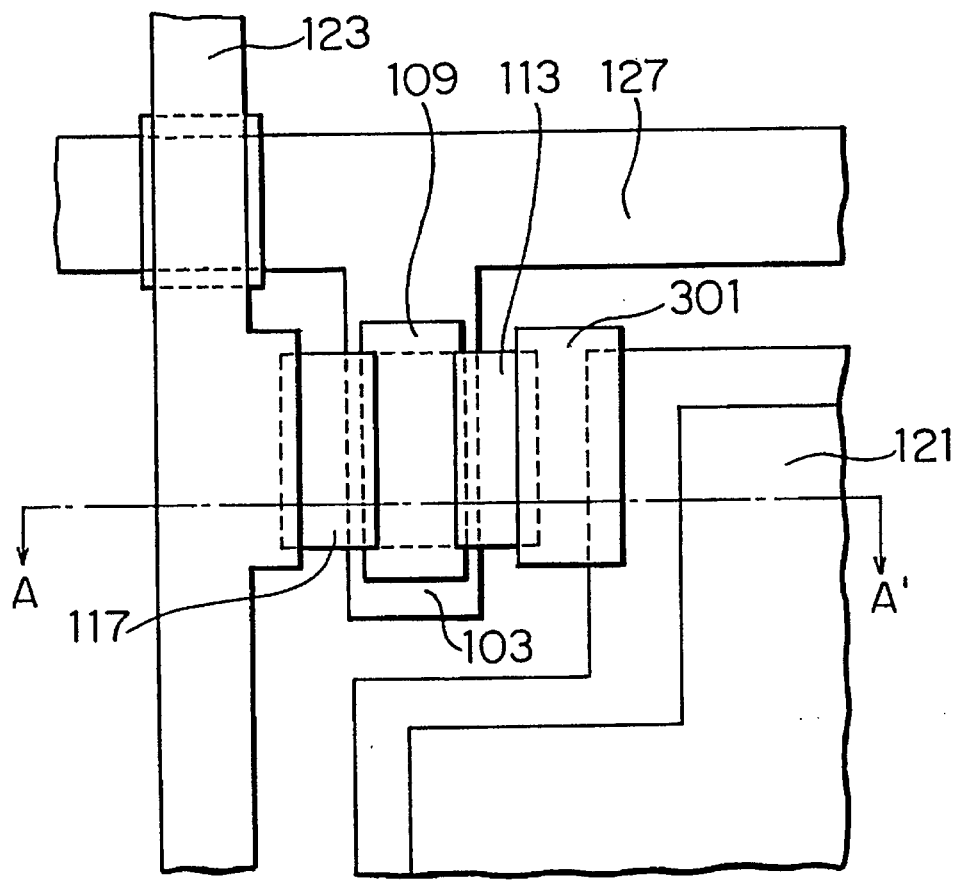
FIG. 5 (a) is a top view showing the construction of a TFT according to a third embodiment of the present invention.

Next, with reference to the accompanying drawings, thin film transistors (TFTs) and fabrication methods thereof according to embodiments of the present invention will be described. To simply the explanation of the features of the TFTs and fabrication methods thereof according to the present invention, TFTs which are applied to projector type liquid crystal display devices will be described. Thus, the applications of the TFTs according to the present invention are not limited to the projector type liquid crystal display devices described in the following embodiments.

FIRST EMBODIMENT

Referring to FIG. 1, a gate electrode 103 is formed over a transparent glass substrate 101. The gate electrode 103 is made of a conductor with low transmittance (such as Mo, Ta, Cr, Al, a laminate thereof, or an alloy thereof). A gate insulating layer 105, a semiconductor layer 107, and a channel-stopper insulator layer 109 are formed over the transparent glass substrate 101 and the gate electrode 103. The semiconductor layer 107 is made of i-amorphous silicon layers. A source electrode 113 is formed over a source region 111 of the semiconductor layer 107. The source electrode 113 is made of a transparent electrical conductive film. A drain electrode 117 is formed over a drain region 115. The drain electrode 117 is made of a transparent electrical conductive film. The source region 111 and the drain region 115 each have an ohmic contact function. The source region 111 and the drain region are ohmic contacted to the source electrode 113 and the drain electrode 117, respectively. The source region 111 and the drain region 115 are formed by doping impurities (phosphorus) in the semiconductor layer 107 excluding a channel region 119. The source electrode 113 and a pixel electrode 121 are integrally formed. The drain electrode 117 is connected to a column line 123.

In the thin film transistor according to this embodiment, impurities are doped at least onto the front surfaces of the source region 111 and the drain region 115 of the semiconductor layer 107 and thereby ohmic contact portions are directly formed. Thus, an ohmic contact layer which was formed as an independent layer over a semiconductor layer 107 can be omitted. Consequently, carriers which were optically induced in the i(intrinsic)-semiconductor layers beneath the source and drain regions can be decreased or removed, thereby reducing a photo leak current caused by photo excitation. In addition, a photo leak current caused by light reflected by an ohmic contact layer made of a material with high reflectance can be removed. Moreover, since the source electrode 113 and the drain electrode 117 are made of a transparent electrical conductive film, they have high transmittance of light, thereby allowing light to pass. Thus, the source electrode 113 and the drain electrode 117 do not reflect and/or scatter light. Consequently, the photo leak current caused by light reflected at the source electrode 113 and the drain electrode 117 can be removed. Thus, the amount of photo leak current of the TFT can be halved in comparison of that of a related art TFT.

In addition, since the ohmic contact layer is omitted, the deterioration of yield and throughput can be prevented.

Next, with reference to FIGS. 2 and 3, a fabrication method of the thin film transistor according to this embodiment will be described. FIGS. 2 (a) to (d) and 3 (e) to (g) are sectional views showing fabrication steps of the thin film transistor according to this embodiment. FIGS. 2 (a') to (d') and FIGS. 3 (e') to (g') are top views corresponding to FIGS. 2 (a) to (d) and FIGS. 3 (e) to (g), respectively.

As shown in FIG. 2 (a), a gate electrode 103 is formed over a transparent glass substrate 101. The gate electrode 103 may be made of a conductor with low transmittance of light (for example, Mo, Ta, Cr, Al, a laminator thereof, or an alloy thereof).

As shown in FIG. 2 (b), a gate insulating layer 105 and a semiconductor layer 107 are deposited over the transparent glass substrate 101 and the gate electrode 103 in succession. The semiconductor layer 107 is formed of i-amorphous silicon films. The gate insulating layer 105 is formed by laminating a $SiO_x$ film with a thickness of 3500 angstroms and a $SiN_x$ film with a thickness of 500 angstroms. As described above, the semiconductor layer 107 is formed of i-amorphous silicon films which has a thickness of 200 to 500 angstroms. For these films, the composition and/or lamination may be changed. For example, the gate insulating layer 105 may be a single layer of $SiN_x$ or a laminate of an anodic oxidation film of Al and $SiN_x$. On the other hand, the i-amorphous silicon films may be doped with a small amount of impurities such as boron (B) or may be partially crystallized.

A $SiO_x$ film or $SiN_x$ film with a thickness of approximately 2000 to 5000 angstroms is formed over the semiconductor layer 107. A photoresist is coated over the $SiO_x$ film or $SiN_x$ film. The photoresist is patterned by back-side exposure method. With a mask of the photoresist 125, the $SiO_x$ film, $SiN_x$ film or the like is patterned so as to form a channel-stopper insulator layer 109. At this point, although the semiconductor layer 107 slightly absorbs light, since the thickness thereof is very small, most of light passes through it. Thus, the photoresist excluding the portion at which the gate electrode 103 is formed is exposed. In this embodiment, with a photomask, mask exposure is performed so as to expose the photoresist on a scanning line 127.

As shown in FIG. 2 (c), with a mask of the channel-stopper insulator layer 109, impurities of phosphorus (P) are doped in the semiconductor layer 107. In reality, the doping process was performed by ionizing a gas (for example, 10% $PH_3+H2$) which contains phosphine ($PH_3$) by grow discharge method and accelerating ions which contain dopant with a voltage applied between a discharging chamber and the substrate. The accelerating voltage was 20 kV. The amount of dose was $5 \times 10^{15}/cm^2$. In this embodiment, by using high frequency discharging method (RF) or a bucket-type ion source, ions were irradiated into the substrate without mass separation. However, another discharging method may be used. In addition, mass-separated implantation may be used. Moreover, laser radiation may be used for diffusion doping process. With energy of ion implantation and laser radiation, part of the semiconductor layer 107 may be crystallized. The impurities are not limited to phosphorus. With boron, a p type TFT may be formed. Furthermore, by ionizing $PH_x$ by grow discharging method, also ions such as described above may be generated.

The accelerating voltage and the amount of dose may be changed corresponding to the film thickness and material characteristics of the semiconductor layer 107 so that the source region 111 and the drain region 115 properly have the ohmic contact function.

The portions of n type a-Si where impurities of phosphorus are doped in the semiconductor layer 107 become the source region 111 and the drain region 115. The region lies between the source region 111 and the drain region 115 and covered with the channel-stopper insulator layer 109 becomes a channel region 119.

As shown in FIG. 2 (d), the semiconductor layer 107 is patterned with a predetermined pattern. At this point, the channel-stopper insulator layer 109 is selectively used as a so-called etching stopper. As shown in FIG. 2 (d'), the semiconductor layer 107 is patterned so that the source region 111 and the drain region 115 are exposed from the channel-stopper insulator layer 109, that the channel region 119 is narrower than the channel-stopper insulator layer 109, and that the channel region 119 is covered with the channel-stopper insulator layer 109. A metal film such as Mo may be formed over the semiconductor layer 107 before the semiconductor layer 107 is patterned.

As shown in FIG. 3 (e), a transparent electrical conductive film 129 is formed over the channel-stopper insulator layer 109 and the semiconductor layer 107 in such a way that the latter is overlaid with the former. In this embodiment, the transparent electrical conductive film 129 is made of indium tin oxide (ITO). A negative-type photoresist is coated over the transparent electrical conductive film 129 and then exposed by back-side exposure method. At this point, light passes through the transparent electrical conductive film 129 and the semiconductor layer 107 in the neighborhood of the TFT except for the portion where the gate electrode 103 is formed. Thus, the photoresist is exposed and non-exposed portion is removed by developing process. With a mask of the photoresist 131 which has been patterned, the transparent electrical conductive film 129 is etched out and patterned. Another photoresist is coated over the substrate so as to form a pattern connecting the pixel electrode 121 which crosses the upper surface of the TFT as shown in FIG. 3 (f). With the patterned photoresist 133, the transparent electrical conductive film 129 is etched out as shown in FIG. 3 (f) so as to form a drain electrode 117, a source electrode 113, and a pixel electrode 121 as shown in FIG. 3 (g). The drain electrode 117 and the source electrode 113 are self aligned.

To decrease the possibility of open line defect of the column line 123, the transparent electrical conductive film 129 is also formed below the column line 123. However, the transparent electrical conductive film 129 may be formed only at a lead-out portion (which connected with source, drain) of the TFT. In this embodiment, the transparent electrical conductive film 129 is not left over an opaque material which had been formed. For example, in case of a storage capacitance for each pixel is formed, after the back-side exposure process is performed for the negative-type photoresist, by front-side exposure process with a mask pattern covering the TFT portion, a photoresist pattern may be formed at a portion where light is blocked by the gate electrode 103. In addition, when an upper electrode of the storage capacitance is formed of the same material of the column line 123 and make the upper electrode connected to the pixel electrode 121, an extra exposure process described above can be omitted. In addition, as opposed to the above-described patterning sequence, the photoresist may be exposed with a mask so as to form a photoresist pattern for the channel width (the lateral direction) of the TFT. Thereafter, by the back-side exposure process, a pattern in the longitudinal direction of the channel may be formed.

A contact hole which connects the gate electrode 103 with gate line outside of TFT is formed through the gate insulating layer 105. A molybdenum (Mo) layer of 500 angstroms, an aluminum (Al) layer of 4000 angstroms, and another molybdenum (Mo) layer of 500 angstroms are formed over the upper surface of the substrate and patterned so as to form a column line 123. It should be appreciated that the column line may be made of another material. Although the column line 123 should be in contact with (the source electrode 113 and) the drain electrode 117, as long as the column line 123 is overlaid with (the source electrode 113 and) the drain electrode 117, even if the pattern deviates, the performance of the TFT is not seriously affected. Thus, accurate alignment of the column line 123 to (the source electrode 113 and) the drain electrode 117 may not be required. If wiring resistance were not concerned (or could be neglected), the drain electrode 117 and the column line 123 could be integrally formed of a transparent electrical conductive film made of ITO or the like. This integral formation of the drain electrode 117 and the column line 123 is preferable because the process of forming the column line 123 of the Mo/Al/Mo layers can be omitted.

Thereafter, if necessary, a passivation film 135 made of $SiN_x$ and the like is formed. Thus, the fabrication of the a-Si TFT has been completed.

As described above, unlike with the related art TFT, since an independent ohmic contact layer (film) is omitted, the yield and throughput are improved.

In addition to the omission of the ohmic contact layer, since the source electrode and the drain electrode are made of a transparent electrical conductive film, the back-side exposure process is easily performed for the photoresist coated over the transparent electrical conductive film because light easily passes to the photoresist. Thus, the yield and throughput are improved. By the back-side exposure method, the source electrode 113 and the drain electrode 117 are self aligned with the gate electrode 103. Thus, without considering accurate alignment of the source electrode 113 and the drain electrode 117 to the source region 111 and the drain region 115, the TFT can be easily fabricated.

In addition, since the transparent electrical conductive film 129 is formed just over the source region 111 and the drain region 115, the thickness of the semiconductor layer 107 may be decreased to 100 angstroms or less. In this case, since carriers which take place in the semiconductor layer 107 by radiation of light can be decreased, a photo leak current of the TFT can be much reduced.

A plasma which is a mixture of impurity ions (such as phosphorus) and hydrogen ions are doped in the semiconductor layer 107. In this case, the plasma functions as a source of a dopant such as phosphorus. At this point, the hydrogen ions are doped in the neighborhood of the front surface of the semiconductor layer 107. And, the impurity ions (phosphorus) are doped not merely in the surface but also in a deep portion of the semiconductor layer 107. Thus, since the resistance of this portion becomes low, the source region 111 and the drain region 117 can be formed in this portion. A transparent electrical conductive film made of such as indium tin oxide (ITO) is formed directly over the source region 111 and the drain region 117. At this point, with the hydrogen ions being doped, the interface of the transparent electrical conductive film is reduced and thereby a ohmic contact portion better than that of former ohmic contact layer is formed in the neighborhood of the front surface of the semiconductor layer 107. Thus, since one plasma doping process allows the source region 111 and the drain region 117 to be formed and the ohmic contact portion to be formed, the fabrication process can be simplified.

SECOND EMBODIMENT

In the first embodiment, a negative-type photoresist was used. However, an image reversal photoresist which is a kind of chemical amplified photoresists may be used. In the second embodiment of the present invention, as an image reversal photoresist, Hoechst AZ5214E is used.

FIG. 4 shows the construction of a second embodiment of the present invention. For the sake of the simplicity, portions similar to the first embodiment are denoted by similar reference numerals thereof and the description thereof is omitted. Thus, portions which have not been explained in the first embodiment will be described.

After the step shown in FIG. 2 (d) has been completed, an image reversal photoresist 201 is coated over a transparent electrical conductive film 129 as shown in FIG. 4 (a). With a mask having a pattern which crosses an upper portion of a TFT and which includes a portion of a pixel electrode, the image reversal photoresist 201 is exposed, and developed, (to be patterned). In this embodiment, with the characteristics of a positive-type photoresist, a predetermined portion of the pattern of the image reversal photoresist 201 is not exposed.

As shown in FIG. 4 (b), the back-side exposure process is performed. The photoresist excluding a portion at which a gate electrode 103 is formed is exposed through the transparent electrical conductive film 129 and a semiconductor layer 107 in the neighborhood of the TFT. When the reversal bake process is performed, an acid produced in the exposed photoresist results in a bridge formation, which prevents the photoresist from dissolving with a developing solution. By performing flood-light exposure process and developing process for the entire surface of the photoresist, the portion which has not been exposed over the gate electrode 103 is dissolved and thereby the photoresist is removed. Thus, a photoresist pattern 203 is obtained. With the photoresist pattern 203, a source electrode 113 and a drain electrode 117 which are self aligned with the gate electrode 103 of the TFT and the transparent electrical conductive film 129 are patterned. With a mask of the photoresist pattern 203, the transparent electrical conductive film 129 is etched out and patterned so as to form the source electrode 113 and the drain electrode 117.

According to the fabrication method of this embodiment, since a photoresist coating step, an etching step of transparent electrical conductive film 129, and a removing step of the photoresist can be preformed at a time, the fabrication process can be simplified.

It should be noted that this embodiment is not limited to the above-described back-side exposure method. Instead, a photoresist may be coated on the front surface of the substrate. With a photomask, the photoresist may be exposed and thereby a photoresist pattern may be formed. With the photoresist pattern, a transparent electrical conductive film 129 may be etched out and patterned so as to form a source electrode 113 and a drain electrode 117.

THIRD EMBODIMENT

Figure 5B:
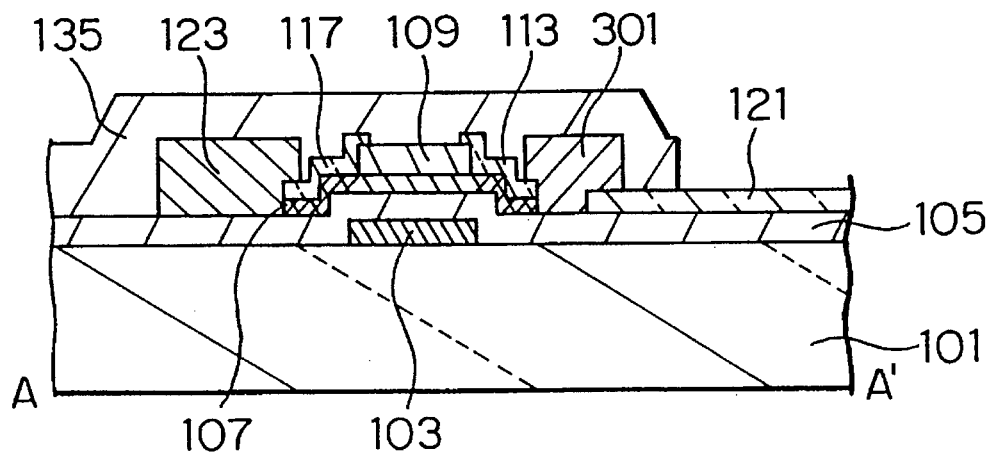

In the second embodiment, a source electrode 113, a drain electrode 117, and a pixel electrode 121 were formed at a time. However, they may be formed in different steps. In this case, the drain electrode 117 and the pixel electrode 121 are connected with a source connecting electrode 301. FIG. 5 (a) is a top view of a third embodiment of the present invention. FIG. 5 (b) is a sectional view corresponding to FIG. 5 (a).

In the third embodiment, the source electrode 113 and the drain electrode 117 are made of TiN. The film thickness of the source electrode 113 and the drain electrode 117 are 100 to 500 angstroms. The source electrode 113 and the drain electrode 117 are connected to the source connecting electrode 301 and a signal electrode 123, respectively. After the step shown in FIG. 2 (c) has been completed, TiN is spattered onto the upper surface of the substrate. A negative-type photoresist is coated over the TiN layer. The negative-type photoresist is exposed by back-side exposure process so as to form a pattern. With a mask of the pattern, the TiN layer is etched out and then a semiconductor film 107 is patterned in an island shape. This back-side exposure process is performed while the entire semiconductor film 107 is being left. Thus, any portion of the semiconductor film 107 can be equally exposed. Consequently, the photoresist pattern can be precisely controlled while the back-side exposure process is being performed for the negative-type photoresist. In particular, the source electrode 113 and the drain electrode 117 can be easily overlapped with and covered inside of a channel-stopper insulator film 109.

The transparent electrical conductive film 129 may be a colored film such as TiN. In addition, the transparent electrical conductive film 129 may be a metal film or a silicide film with a thickness of 50 to 100 angstroms which is used for a conventional electrode layer. Since such a film has proper transmittance, it may be used for the back-side exposure process. The transparent electrical conductive film 129 may be made of a material where the resistance of the electrode portion is smaller than the channel resistance when the TFT is turned on. So, in addition, the transparent electrical conductive film 129 may be made of for example germanium or an alloy thereof.

FOURTH EMBODIMENT

In a fourth embodiment, before a transparent electrical conductive film 129 is formed, a very thin silicide film 401 is formed on the front surface of a semiconductor film 107.

Figure 6:
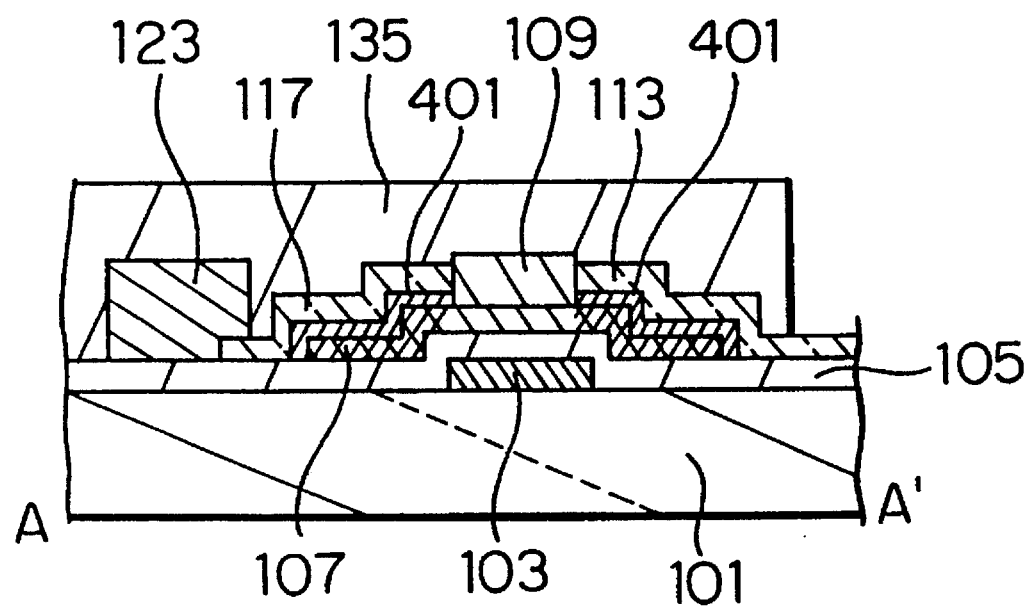
FIG. 6 is a sectional view showing the construction of a TFT according to a fourth embodiment of the present invention.

FIG. 6 shows the construction of the fourth embodiment of the present invention. A layer on which a metal and silicon are reacted is named a silicide. For example, a silicide film 401 is formed in the following manner. After the step shown in FIG. 2 (c) has been completed, dilute hydrofluoric acid is applied on the front surface of the semiconductor film 107 so as to remove a natural oxide film and the like. A metal layer made of Mo, Ta, Ti, Ni, or W or an alloy thereof is deposited on the front surface of the semiconductor film 107. If necessary, the substrate is annealed so as to speed up the chemical reaction. The metal film other than the silicide portion is removed by etching process or the like. Thus, the silicide film 401 is obtained. With the silicide film 401, the transparent electrical conductive film 129 and the semiconductor film 107 can be securely adhered. Thus, defects such as peeling of conductive film 129 can be reduced. If the silicide film 401 were very thin, the resistance thereof would become unstable. However, since basic electrodes are made of the transparent electrical conductive film 129 and the thickness thereof is very thin, the serial resistance thereof does not adversely increase. In addition to the direct contact of the ITO and a-Si, the silicide film 401 can be intervening between the ITO and a-Si so as to securely decrease the contact resistance at the interface therebetween.

FIFTH EMBODIMENT

In a fifth embodiment, a silicide film 401 which was used in the fourth embodiment is used. In addition, a source electrode 113 and a drain electrode 117 are deposited over the silicide film 401 by chemical plating method.

As shown in FIG. 7 (a), the silicide film 401 is formed over a semiconductor film 107. As shown in FIG. 7 (b), the entire substrate of the substrate is dipped in a chemical plating solution so as to deposit a chemical plating film 501 on a portion other than a channel-stopper insulator film 109.

When the chemical plating film 501 is deposited on the silicide film 401 over the semiconductor film 107 other than the channel-stopper insulator film 109, the chemical plating film 501 can be selectively deposited over the silicide film 401. At this point, the adhesive strength of the chemical plating film 501 is improved. The silicide film 401 made of a metal such as Mo or Ti prevents the chemical plating film 501 from reacting with Si of the semiconductor film 107. Thus, a plating material made of Ni or the like where the silicide grows at a relatively low temperature can be used.

In this embodiment, in reality, with a chemical plating solution whose main component was Ni, the chemical plating film 501 was formed with a thickness of approximately 500 angstroms. More specifically, dimethylaminoborane (DMAB) as a reducing agent was mixed with nickel sulfate as a chemical plating solution. Thereafter, the resultant solution was mixed with pyrophosphoric acid and ammonia. Thus, the resultant chemical plating solution became alkaline. Instead, hydrazine or potassium hypophosphite as a reducing agent may be mixed with nickel sulfate or nickel chloride. The resultant solution may be mixed with ethylene diamine. As a plating solution, various types may be used. As a plating material, Co, Cu, noble metal, Mo, or Ti may be used as well as Ni.

In addition, by changing the plating conditions, the film thickness of the source electrode 113 and the drain electrode 117 may be controlled so as to decrease the electrode resistance and improve the transmittance of light.

The chemical plating film 501, the silicide film 401, and the semiconductor film 107 are etched out with a mask of a photoresist 503, so as to form a predetermined pattern. A source connecting electrode 301 and a column line 123 are formed over the chemical plating film 501 corresponding to a source electrode and a drain electrode, respectively. As with above-described embodiments, a passivation film 135 is formed and thereby an a-Si TFT is obtained.

In the fifth embodiment, a source electrode 113 and a drain electrode 117 can be self aligned with and deposited over a source region 111 and a drain region 115 of a semiconductor film 107 by chemical plating method with intervening a silicide film 401 between semiconductor film 107, and source region 111 and drain region 115. In addition, back-side exposure process can be used. Thus, the fabrication process of the TFT can be simplified and the fabrication cost can be lowered. Moreover, since electrodes are formed by chemical plating method, even if the thickness of the semiconductor film 107 is decreased, it is not eroded by a reaction with a metal of the electrode layer. Thus, deterioration of the interface characteristics (such as increase of resistance on a joint surface) can be prevented.

In addition, a metal film made of Mo or the like may be deposited over the chemical plating film 501. The chemical plating film 501 may be patterned along with the metal film so as to form a source electrode 113 and a drain electrode 117. When phosphorus (P) is added to the chemical plating film 501, a contact resistance against an n type semiconductor is improved. When boron (B) is added to the chemical plating film 501, a contact resistance against a p type semiconductor is improved. Thus, by selectively adding phosphorus or boron, the contact resistance can be further improved.

In this embodiment, the silicide film 401 was used. However, even if the silicide film 401 is omitted, although the plating process control including the plating solution becomes difficult to some extent, after the doping step has been performed, a film can be selectively grown on the semiconductor film 107 than on the channel-stopper insulator 109. This fact was experimentally confirmed by the inventors of the present invention. When the silicide film 401 is omitted, the fabrication process can be further simplified. In addition, by applying a predetermined voltage to the silicide film 401 and the semiconductor film 107 which has been doped, they may be electrolytically plated.

SIXTH EMBODIMENT

In a sixth embodiment, a source electrode 113 and a drain electrode 117 are formed by lift-off method. FIG. 8 shows fabrication steps of a TFT according to the sixth embodiment.

After the step shown in FIG. 2 (b) has been completed, a transparent film 601 made of ITO with a thickness of 1000 to 2000 angstroms is formed over a channel-stopper insulator film 109. As shown in FIG. 8 (a), a photoresist 603 is deposited over the transparent film 601. A photoresist pattern is formed by back-side exposure method. With a mask of the photoresist pattern, the transparent film 601 and the channel-stopper insulator film 109 are etched out in succession. Thus, as shown in FIG. 8 (b), the channel-stopper insulator film 109 is formed inside the transparent film 601. A source region 111 and a drain region 115 are formed by plasma doping method. As shown in FIG. 8 (c), a transparent electrical conductive film 129 made of Ta with a thickness of 100 to 500 angstroms is deposited over the source region 111 and the drain region 115. Instead, a thin film made of Ti or Cr may be used as the transparent electrical conductive film 129.

When the transparent film 601 is etched out, the transparent electrical conductive film 129 over the channel-stopper insulator film 109 is lifted off. Thus, the transparent electrical conductive film 129 is left over the source region 111 and the drain region 115 of the TFT. The transparent electrical conductive film 129 and the semiconductive film 107 are patterned so as to form a source electrode 113 and a drain electrode 117. Thus, as with the above-described embodiments, the fabrication of the TFT has been completed.

When the TFT is fabricated by the lift-off method, the transparent film 601 is formed over the channel-stopper insulator film 109. Thus, when a plasma is applied to the channel-stopper insulator film 109, light hydrogen ions and the like other than a dopant are not deeply doped in the channel-stopper insulator film 109. Thus, the characteristics of the TFT are improved. This fact was experimentally confirmed by the inventors of the present invention.

In addition, heavy ions are not doped in the channel-stopper insulator film 109. Such an effect applies to an insulating film such as a Ti oxide film and the photoresist pattern which is left after the back-side exposure process is performed. In particular, since In and Sn atoms which construct the ITO film are heavy, they have high ion blocking capability. Further, when the doping process is performed, charge-up can be preferably prevented. It should be noted that such a doping mask can be used for other embodiments of the present invention. In addition, in the plasma doping method, since the incident angle and doping range of ions are large, as shown in FIG. 8 (b), even if the transparent film 601 is over-hung on the channel-stopper insulator film 109, it does not adversely affect the doping process. Thus, ions can be properly doped in the semiconductor film 107. Instead, while the substrate is being rotated or inclined, the semiconductor film 107 may be doped or the over-hang portion of the transparent film 601 may be etched out.

SEVENTH EMBODIMENT

FIGS. 9 and 10 show fabrication steps according to a seventh embodiment. After the steps shown in FIGS. 2 (a) and (b) have been completed, as shown in FIG. 9 (a), with a mask of a channel-stopper insulator film 109, impurities are doped in a semiconductor film 107. As a doping method, the above-described plasma doping method or another doping method as described in the first embodiment may be used. The front surface of the semiconductor film 107 is cleaned so as to remove a surface oxide film. As shown in FIG. 9 (b), a metal film 701 is formed over the front surface of the semiconductor film 107. In this embodiment, in reality, as the material of the metal film 701, Mo was used. However, another material which reacts with a semiconductor and is suitable for forming a conductor may be used. An example of this material is a metal such as Ti, Cr, Ni, Pd, W, Mo or an alloy of these metals such as MoW, MoTa, NiMoW. Further the alloy is made of a material which forms a silicide at a low temperature (such as Co, Ni, or Pd) and a metal with a high melting point which does not form a silicide at a low temperature (such as Mo, Ta, or W). A thin silicide film 401 is formed at the interface of the metal film 701 and the semiconductor film 107. When a laminate of a material with a thickness of around 50 angstroms where a silicide grows at a low temperature (such as Ni or Pd) and a material with a high melting point where a silicide does not grow at a low temperature (such as Mo, Ta or W), the resistance of the silicide film 401 becomes stable. In addition, without erosion of the semiconductor film 107, the silicide film 401 can be preferably formed. In addition, the silicide film 401 may be annealed at a temperature ranging from 200° to 300° C. In this embodiment, in reality, the film thickness of the silicide film 401 was 50 to 200 angstroms. The sheet resistance of the silicide film 401 was $10^3$ to $10^6$ ohm/□.

The metal film 701, the semiconductor film 107, and the silicide film 401 are patterned by photolithography method as shown in FIG. 9 (c). At this point, the side walls of the semiconductor film 107 in the lateral direction of the channel are disposed inside the width of the pattern of the channel-stopper insulator film 109. In reality, the channel-stopper insulator film 109 and the semiconductor film 107 were selectively etched out and patterned. In other words, a part of the channel-stopper insulator film 109 which protruded from the pattern of the metal film 701 was left as a mask of the semiconductor film 107. As shown in FIG. 9 (c"), the semiconductor film 107 was left in such a way that the side walls of the channel-stopper insulator film 109 matched or slightly protruded from the side walls of the semiconductor film 107. Thus, in a later electrode forming step, the area where the side walls of the semiconductor film 107 are in contact with a metal is not increased. In addition, since the side walls in the lateral direction of the channel of the semiconductor film 107 are disposed inside the end portion of the channel-stopper insulator film 109, the silicide film 401, the drain electrode, the source electrode, and so forth do not come in contact with the side walls of the semiconductor film 107. Thus, since an increase of leak current is prevented, the operational characteristics of the thin film transistor can be improved.

The side walls of the semiconductor film 107 which has been patterned are oxidized so as to prevent them from reacting with an electrode material which will be formed next. The side walls of the semiconductor film 107 may be oxidized by annealing process in oxygen atmosphere or by exposing process with oxygen plasma. This fact was experimentally confirmed by the inventors of the present invention. The oxidized portion may contain nitrogen, carbon, or the like. In addition, by dipping the semiconductor film 107 in a solution of polysilane or OCD, the side walls may contain a substance which restricts silicide reaction.

As shown in FIG. 10 (d), a pixel electrode 121 is formed. The rest of the metal film 701 is removed. A column line 123 and a source connecting electrode 301 are made of a laminate of Mo and Al. The electrode material may be made of other materials such as a laminate of Ti and Al. Thus, an increase of leak current which takes place due to a reaction between the side walls of the semiconductor film 107 and the electrode metal film such as the column line 123 can be prevented. This effect is important for improving the display quality of a liquid crystal display device. This is because this effect prevents a liquid crystal applying voltage from lowering in its holding period.

Thereafter, as with the above-described embodiments, a passivation film 135 and the like are formed. Thus, the fabrication of the TFT has been completed. Alternatively, the passivation film 135 may be omitted.

In FIG. 10 (e), the source electrode 113 and/or the drain electrode 117 may be patterned so that they are overlapped with the channel-stopper insulator film 109. When the electrodes and the silicide film 401 are contacted with a wide area, even if the resistance of the silicide film 401 becomes unstable and increases, a required current can be preferably obtained.

In this embodiment, impurities were doped in the semiconductor film 107 so as to form the source region 111 and the drain region 115. However, a semiconductor film 107 which has been doped with impurities may be formed by CVD method or the like. A negative-type photoresist may deposited over the semiconductor film. By back-side exposure method, the photoresist over a gate may be removed and patterned. With a mask of this pattern, the semiconductor film may be etched out. In this case, the side walls of the semiconductor film 107 may be processed in the above-mentioned manner.

EIGHTH EMBODIMENT

In an eighth embodiment, as a modification of the first embodiment, a black-matrix 801 (for TFT-LCD) is used as a self-alignment mask used in photolithography process. In addition, by applying a predetermined voltage to the black-matrix 801 for each horizontal scanning time, the black-matrix 801 can be used as a storage capacitance electrode.

As shown in FIG. 11 (a), the black-matrix 801 is formed below a gate insulating film 105. The material of the black-matrix 801 is the same as that of a gate electrode 103. A transparent electrical conductive film 129 is formed and then a photoresist is deposited thereon. The photoresist is exposed by back-side exposure method. At this point, with a mask of the black-matrix 801, a photoresist pattern 803 which defines an outer peripheral portion of a pixel electrode 121 is formed. As shown in FIG. 11 (b), with a photomask, the photoresist is patterned. An unnecessary portion is removed by photolithography method. The pixel electrode 121, a source electrode 113, and a drain electrode 117 are formed. A column line 123, a passivation film 135, and so forth are formed. Thus, as shown in FIG. 11 (c), the fabrication of the TFT has been completed.

Since the black-matrix 801 is used for a self-alignment mask for the pixel electrode 121, it is not necessary to overlap the black-matrix 801 with the pixel electrode 121. Thus, the aperture ratio of the pixels of the liquid crystal display device can be improved. In addition, since the self-alignment steps of TFT and pixel can be conducted at the same time, the fabrication cost of the TFT can be effectively reduced.

At a corner portion of the black-matrix 801, when back-side exposure process is performed, exposure amount is reduced. Thus, the shape of the edges of the pixel electrode 121 is narrowed. Consequently, the disclination of the liquid crystal in the neighborhood of this portion cannot be concealed. To prevent this problem, another black-matrix may be disposed on an opposed substrate. Alternatively, the corner portion of the black-matrix 801 may be rounded.

NINETH EMBODIMENT

Figure 12A:
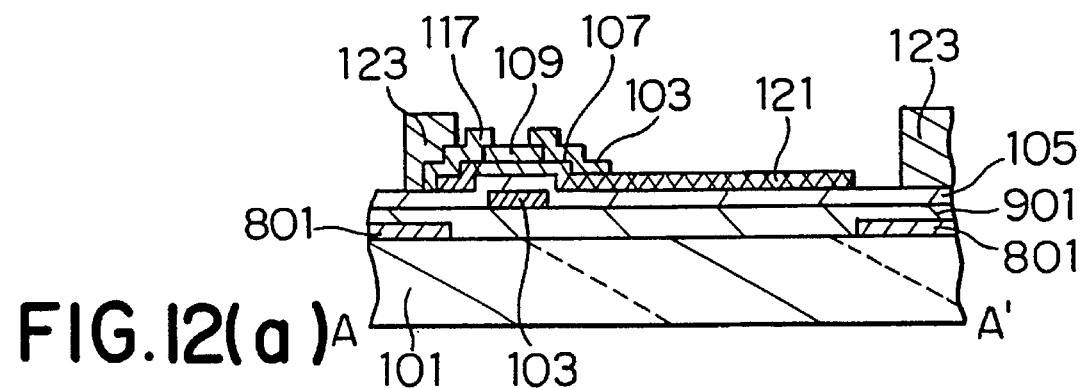
FIG. 12 (a) is a sectional view showing the construction of a TFT according to a ninth embodiment of the present invention.
Figure 12B:
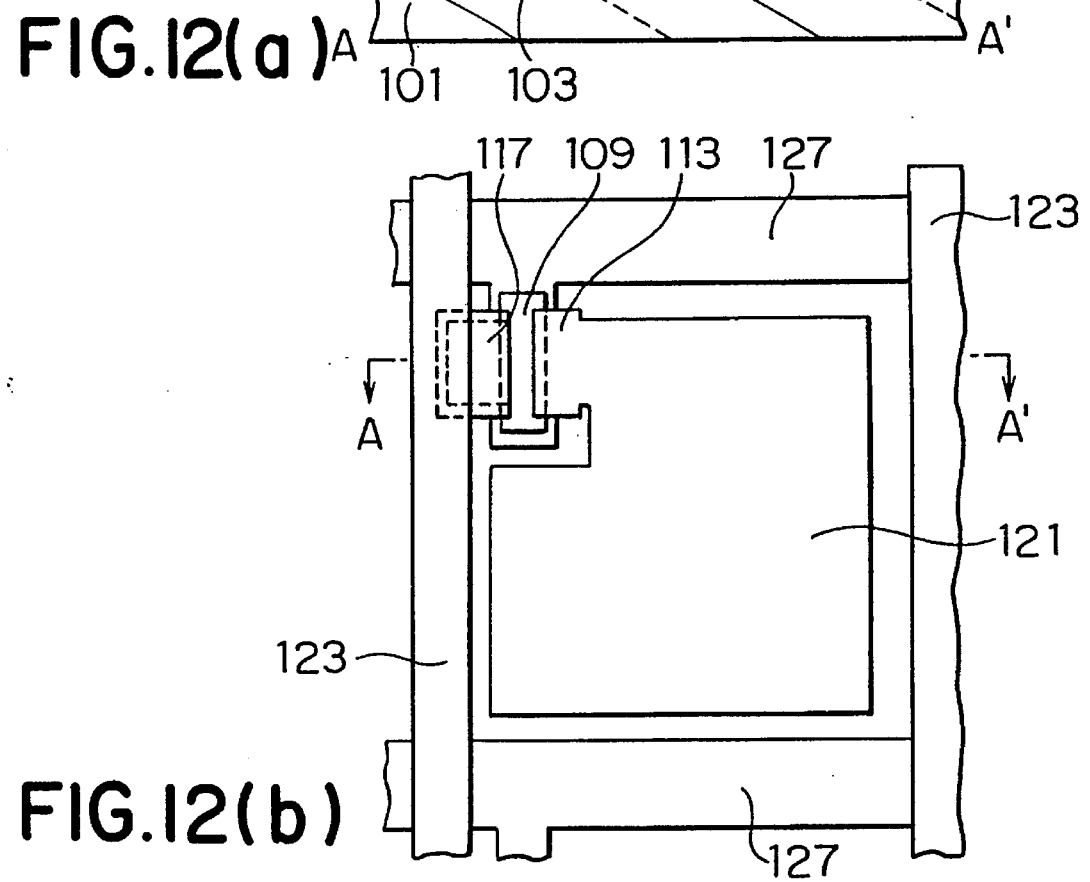
Figure 12C:
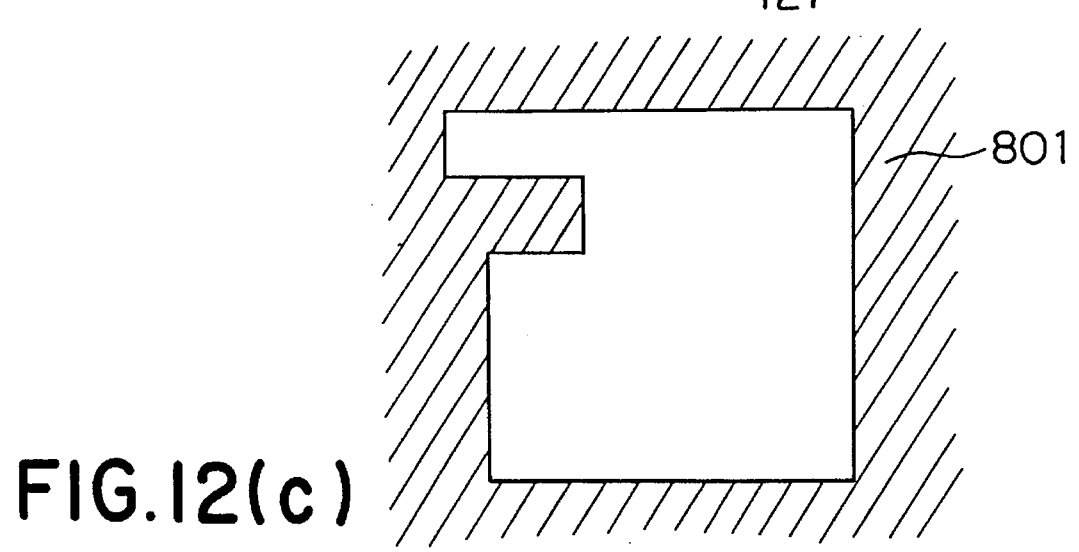
Figure 16:
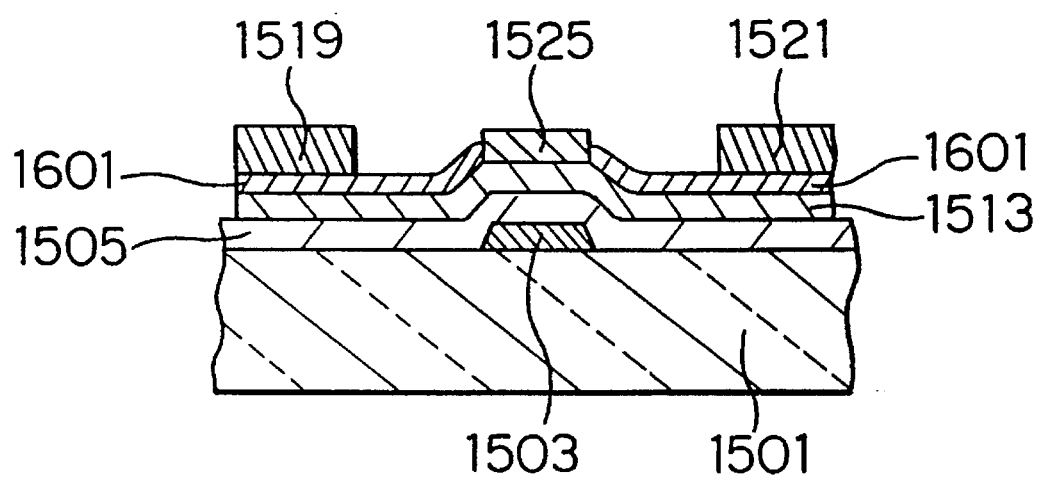
FIG. 16 is a sectional view showing the construction of a TFT having a conventional silicide film.

FIG. 12 shows a ninth embodiment of the present invention. In this embodiment, a black-matrix 801 made of a metal as a light insulating film is formed below a gate electrode 103 through an insulating film 901. The black-matrix 801 is patterned so that it surrounds a gate electrode 103 (and a channel region 119). When the black-matrix 801 is formed in such a way, a storage capacitance 801 can be formed between the black-matrix 801 and the pixel electrode 121 through an insulating film 901. In addition, shortcircuits of the gate electrode 103, the scanning line 127, and the column line 123 against the pixel electrode 121 can be prevented. In addition, since the black-matrix 801 functions as an electrostatic shield, the parasitic capacitance between each electrode and the pixel electrode 121 can be preferably decreased. The shape of the black-matrix 801 is not limited to that shown in FIG. 12. Instead, the TFT may cross the scanning line 127.

In the fabrication process of this embodiment, the black-matrix 801 and the gate electrode 103 are formed in different steps. In addition, a step for forming an insulating film 901 between the black-matrix 801 and the gate electrode 103 is added. Thus, as with the first embodiment and the like, a transparent electrical conductive film 129 is patterned with a negative-type photoresist by back-side exposure method so as to form a source electrode 113, a drain electrode 117, and a pixel electrode 121 in the same process. Thus, as with the above-described embodiments, the fabrication steps can be simplified and the aperture ratio of pixels can be improved.

TENTH EMBODIMENT

FIGS. 13 and 14 show fabrication steps according to a tenth embodiment. In this embodiment, a silicide film 1003 is slightly spaced apart from a channel-stopper insulator film 109.

As with the first embodiment and the like, before a gate electrode 103, a semiconductor film 107, and a channel-stopper insulator film 109 are formed, an insulating film is deposited. By dual exposure method using back-side exposure process with a positive-type photoresist and front side exposure process with a mask pattern, a pattern is formed. The channel-stopper insulator film 109 is made of a $S_iN_x$ film and formed by plasma CVD method or the like. The gate insulating film 105 is made of a laminate of $S_iO_x$ and $S_iN_x$. The channel-stopper insulator film 109 is etched out and then the photoresist is removed.

The exposed portion of the semiconductor film 107 is cleaned so as to remove a surface oxide film. A metal film 1001 is formed on the front surface of the semiconductor film 107. In this embodiment, in reality, as the metal film 1001, Mo was used. However, a material which reacts with the semiconductor film 107 and forms a silicide (such as a laminate made of a plurality of films, an alloy of metals of Cr, Ni, Pd, W or Mo) may be used. An alloy of a material which forms a silicide at a low temperature (such as Co, Ni, or Pd) and a material with a high melting point which does not form a silicide at a low temperature (such as Mo or Ta) may be used. With such an alloy, a film according to the metal film 1001 can be easily formed.

As shown in FIG. 13 (a), a thin silicide film 1003 (reacting layer) is formed at the interface of the semiconductor film 107 and the metal film 1001. The silicide film 1003 may be annealed at a temperature of 200° to 300° C. In reality, when the silicide film 1003 was made of Mo, the film thickness thereof was 50 to 200 angstroms. The sheet resistance of the silicide film 1003 was $10^3$ to $10^6$ ohm/□.

As shown in FIG. 13 (b), the rest of the metal film 1001 which has not be reacted is removed so as to expose the silicide film 1003. The channel-stopper insulator film 109 is slightly etched out. At this point, each end of the pattern is inwardly moved. Thus, the channel-stopper insulator film 109 is slightly spaced apart from the silicide film 1003. Although the preferred gap between the side walls of the silicide film and the side walls of the channel-stopper insulator film 109 depends on the withstand voltage and current required for the thin film transistor, it is preferably 200 to 1000 angstroms.

The semiconductor film 107 is doped through the silicide film 1003 so as to form a source region 111 and a drain region 115 with high impurity concentration (high dose). Thus, a region from the end portion of the silicide film 1003 to the inner portion of the semiconductor film 107 is doped with high impurity concentration. In this embodiment, the length of the region with the high impurity concentration of the semiconductor film 107 on which the silicide film 1003 is not formed is 200 to 1000 angstroms. When plasma doping method is used, impurities can be preferably doped for a large area at a time. However, another doping method may be used.

As shown in FIG. 13 (c), with a photoresist 1005, the semiconductor film 107 and the silicide film 1003 are etched out and patterned so as to form a source electrode 113 and a drain electrode 117. This patterning process can be performed in the same manner as that of the seventh embodiment. After a pixel electrode 121 is formed as shown in FIG. 14 (d) and a contact hole and the like are formed, a source connecting electrode 301, a column line 123, and so forth are formed as shown in FIG. 14 (e). In this embodiment, in reality, the material of the electrode layer such as the source electrode 113 was a laminate of Ti, Al, and Mo (or Ti). Instead, a laminate of Mo and Al may be used. As a pre-step of the deposition of the electrode layer, a material where silicide reaction does not easily take place may be thinly formed in the same manner as that of the seventh embodiment. A material made of Ti which does not easily form a silicide may be formed over an n-type layer.

As with the other embodiments, a passivation film 135 and the like are formed. Thus, the fabrication of the TFT has been completed.

In a conventional TFT where a silicide film 401 is in contact with a channel-stopper insulator film 109, a channel region 119 which protrudes from the channel-stopper insulator film 109 is directly in contact with the silicide film 401. Alternatively, a current flows from the silicide film 401 to the channel region 119 through insufficient ohmic contact. Thus, an off-current increases.

However, according to this embodiment of the invention, the channel region 119 of the semiconductor film 107 is not directly in contact with the silicide film 401. Thus, a current flows in a normal route (namely, from the front surfaces of the drain region 115 and the source region 111 where the silicide film 401 and the ohmic contact portion are formed, to the channel region 119). Thus, an off-current which flows in an incorrect route can be suppressed.

In particular, a leak current can be suppressed. The leak current takes place because carriers (holes in the case of n channel TFT) are induced when the gate voltage is applied in the off-direction (negative voltage in the case of the n channel TFT) and flows in the source region 111. This effect is determined by the locations of each portion of the silicide film 401, the channel region 119, the source region 111, and the drain region of the semiconductor film 107. Thus, for a modification of the tenth embodiment, the techniques described in the above-described embodiments can be applied.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A thin film transistor comprising:

a transparent insulating substrate:

a gate electrode formed over said transparent insulating substrate;

a gate insulating layer formed over said gate electrode in such a way that said gate electrode is overlaid with said gate insulating layer;

a semiconductor layer formed on said gate insulating layer, having a source region, a drain region, and a channel region, said source region being doped with impurities and having an ohmic contact portion at least on the front surface thereof, said drain region being doped with impurities and having an ohmic contact portion at least on the front surface thereof, said channel region being formed between said source region and said drain region, a source electrode made of a transparent electrical conductive film, said source electrode being disposed on the front surface of said source region, said source electrode being ohmic contacted to the front surface of said source region;

a drain electrode made of a transparent electrical conductive film, said drain electrode being disposed on the front surface of said drain region, said drain electrode being ohmic contacted to the front surface of said drain region; and a channel-stopper insulator layer formed over said channel region, the width of said channel-stopper insulator layer being wider than the channel width of said channel region of said semiconductor layer.

2. The thin film transistor as set forth in claim 1, further comprising:

a silicide layer formed on the front surface of said source region and on the front surface of said drain region respectively.

3. A thin film transistor comprising:

a transparent insulating substrate:

a gate electrode formed over said transparent insulating substrate;

a gate insulating layer formed over said gate electrode in such a way that said gate electrode is overlaid with said gate insulating layer;

a semiconductor layer formed on said gate insulating layer, having a source region, a drain region, and a channel region, said source region being doped with impurities and having an ohmic contact portion at least on the front surface thereof, said drain region being doped with impurities and having an ohmic contact portion at least on the front surface thereof, said channel region being formed between said source region and said drain region, a source electrode made of a transparent electrical conductive film, said source electrode being disposed on the front surface of said source region, said source electrode being ohmic contacted to the front surface of said source region;

a drain electrode made of a transparent electrical conductive film, said drain electrode being disposed on the front surface of said drain region, said drain electrode being ohmic contacted to the front surface of said drain region; and a channel-stopper insulator layer formed over said channel region, the width of said channel stopper insulator layer being wider than the channel width of said channel region of said semiconductor layer, wherein side walls of said channel region along its length dimension are oxidized.

4. A thin film transistor, comprising:

an insulating substrate;

a gate electrode formed over said insulating substrate;

a gate insulating layer formed over said gate electrode in such a way that said gate electrode is overlaid with said gate insulating layer;

a semiconductor layer formed on said insulating layer and having a source region, a drain region, and a channel region, said source region being doped with impurities and having an ohmic contact portion at least on the front surface thereof, said drain region being doped with impurities and having an ohmic contact portion at least on the front surface thereof, said channel region being formed between said source region and said drain region; and a channel-stopper insulator layer formed over said channel region, wherein said channel-stopper insulator layer is wider than the channel width of said channel region of said semiconductor layer, and side walls of said channel region along its length dimension are oxidized.

5. The thin film transistor as set forth in claim 4, further comprising:

a silicide layer formed on the front surface of said source region and on the front surface of said drain region.

* * * * *